United States Patent
Li et al.

(10) Patent No.: US 12,512,412 B2
(45) Date of Patent: Dec. 30, 2025

(54) SUBSTRATE WITH MULTIPLE CORE LAYERS TO PROVIDE VARIED THICKNESS CAVITIES SUPPORTING VARIED THICKNESS EMBEDDED ELECTRICAL DEVICES, AND RELATED INTEGRATED CIRCUIT (IC) PACKAGES AND FABRICATION METHODS

(71) Applicant: QUALCOMM Incorporated, San Diego, CA (US)

(72) Inventors: Xia Li, San Diego, CA (US); John Holmes, Escondido, CA (US); Aniket Patil, San Diego, CA (US); Bin Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 376 days.

(21) Appl. No.: 18/304,195

(22) Filed: Apr. 20, 2023

(65) Prior Publication Data

US 2024/0355747 A1  Oct. 24, 2024

(51) Int. Cl.
*H01L 23/538* (2006.01)
*H01L 21/48* (2006.01)
(Continued)

(52) U.S. Cl.
CPC ........ *H01L 23/5383* (2013.01); *H01L 21/481* (2013.01); *H01L 23/3128* (2013.01);
(Continued)

(58) Field of Classification Search
CPC .............. H01L 23/5383; H01L 21/481; H01L 23/5389; H01L 23/3128; H01L 24/19;
(Continued)

(56) References Cited

U.S. PATENT DOCUMENTS

2007/0117338 A1  5/2007  Yamamoto et al.
2011/0216513 A1  9/2011  Lee et al.
(Continued)

OTHER PUBLICATIONS

Light, D., "Novel Fine Pitch, Low Profile, Low Cost Connector Technology," IEEE Components, Packaging and Manufacturing Technology Chapter, SCV, Jun. 9, 2010, available from the Internet: [URL: https://ewh.ieee.org/soc/cpmt/presentations/cpmt1006a.pdf], 30 pages.

(Continued)

*Primary Examiner* — Changhyun Yi
(74) *Attorney, Agent, or Firm* — Withrow & Terranova, PLLC

(57) ABSTRACT

Substrate with multiple core layers to provide varied thickness cavities supporting varied thickness embedded electrical devices, and related integrated circuit (IC) packages and fabrication methods. To provide for core layer of the substrate to support multiple embedded electrical devices, multiple core layers are provided in the substrate. Providing multiple core layers in the substrate allows multiple cavities to be formed in the core layers at multiple depths to compatibly support embedding of multiple electrical devices of varied thicknesses in the core layers. Thus, providing multiple core layers in the substrate can compatibly support forming cavities of multiple thicknesses that are compatible with multiple electrical devices of different thicknesses to be embedded therein. In this manner, design parameters of the overall thickness of the core layer of a substrate can be independent of the variation in thicknesses of multiple embedded electrical devices desired to be embedded therein.

29 Claims, 20 Drawing Sheets

(51) Int. Cl.
*H01L 23/00* (2006.01)
*H01L 23/31* (2006.01)

(52) U.S. Cl.
CPC .......... *H01L 23/5389* (2013.01); *H01L 24/19* (2013.01); *H01L 24/20* (2013.01); *H01L 24/16* (2013.01)

(58) Field of Classification Search
CPC ... H01L 24/20; H01L 24/16; H01L 23/49822; H01L 23/49816; H01L 24/32; H01L 2224/19
See application file for complete search history.

(56) References Cited

U.S. PATENT DOCUMENTS

| | | |
|---|---|---|
| 2019/0237382 A1* | 8/2019 | Kim .................... H01L 24/92 |
| 2020/0411473 A1 | 12/2020 | Chen et al. |
| 2021/0082890 A1 | 3/2021 | Kim |
| 2022/0007511 A1 | 1/2022 | Jeong et al. |
| 2023/0105030 A1 | 4/2023 | Hwang |
| 2024/0371736 A1 | 11/2024 | Bchir et al. |

OTHER PUBLICATIONS

Rocket PCB, "IC substrate technology Guide," Mar. 24, 2021, available on the Internet: [URL: https://www.rocket-pcb.com/ic-substrate-technology-guide], 12 pages.

U.S. Appl. No. 18/310,331, filed May 1, 2023.

* cited by examiner

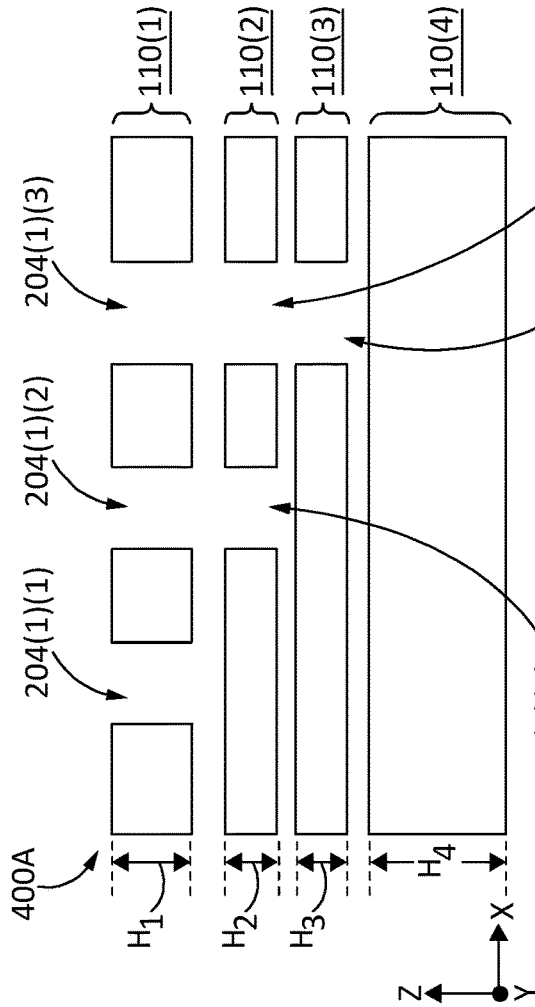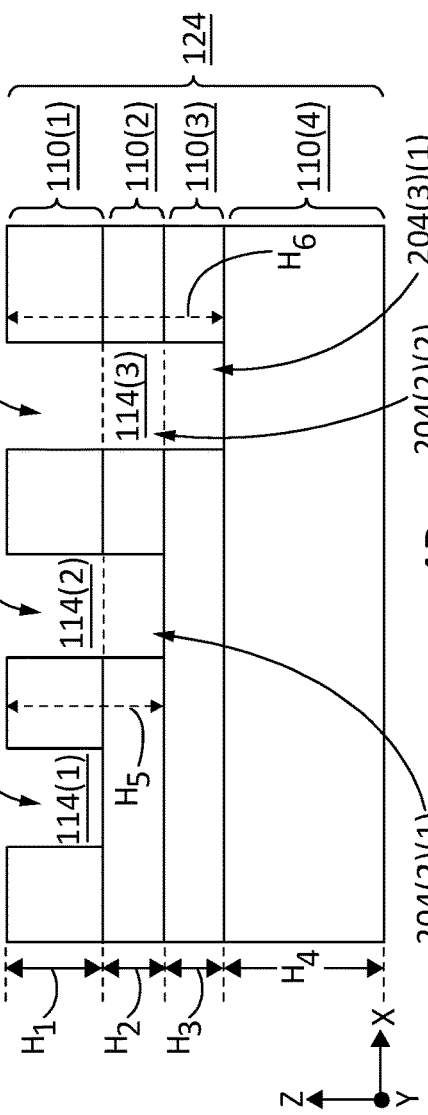

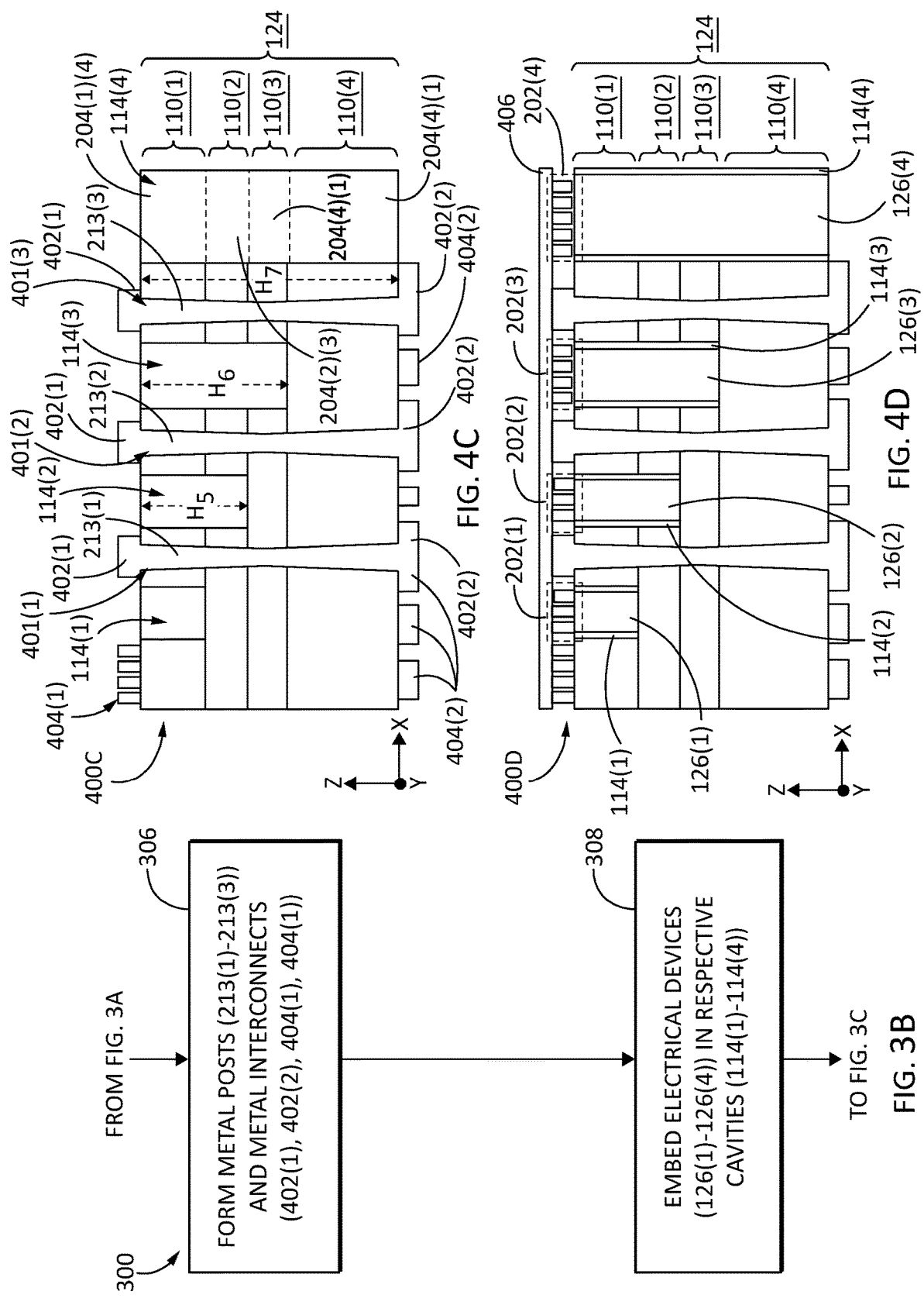

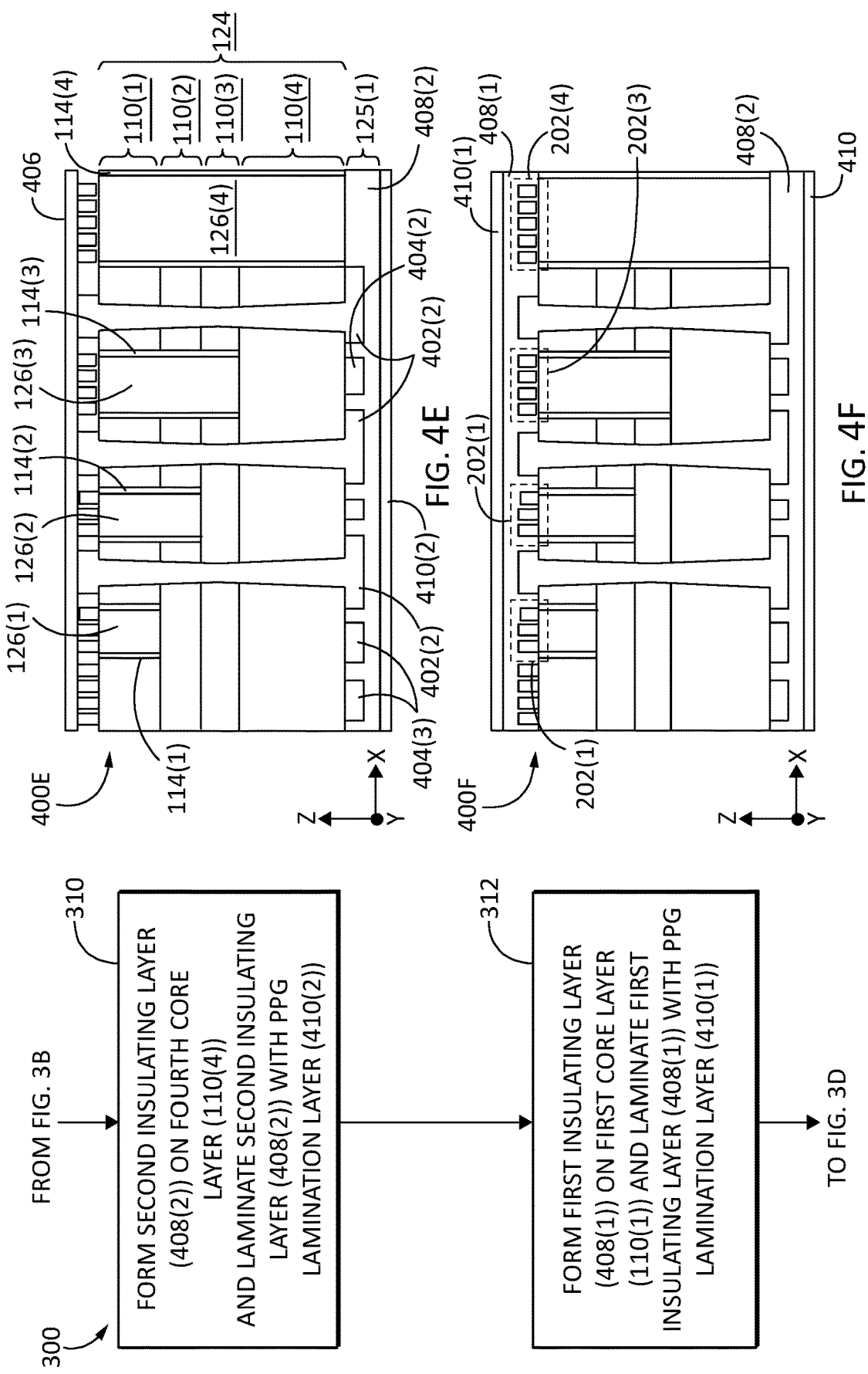

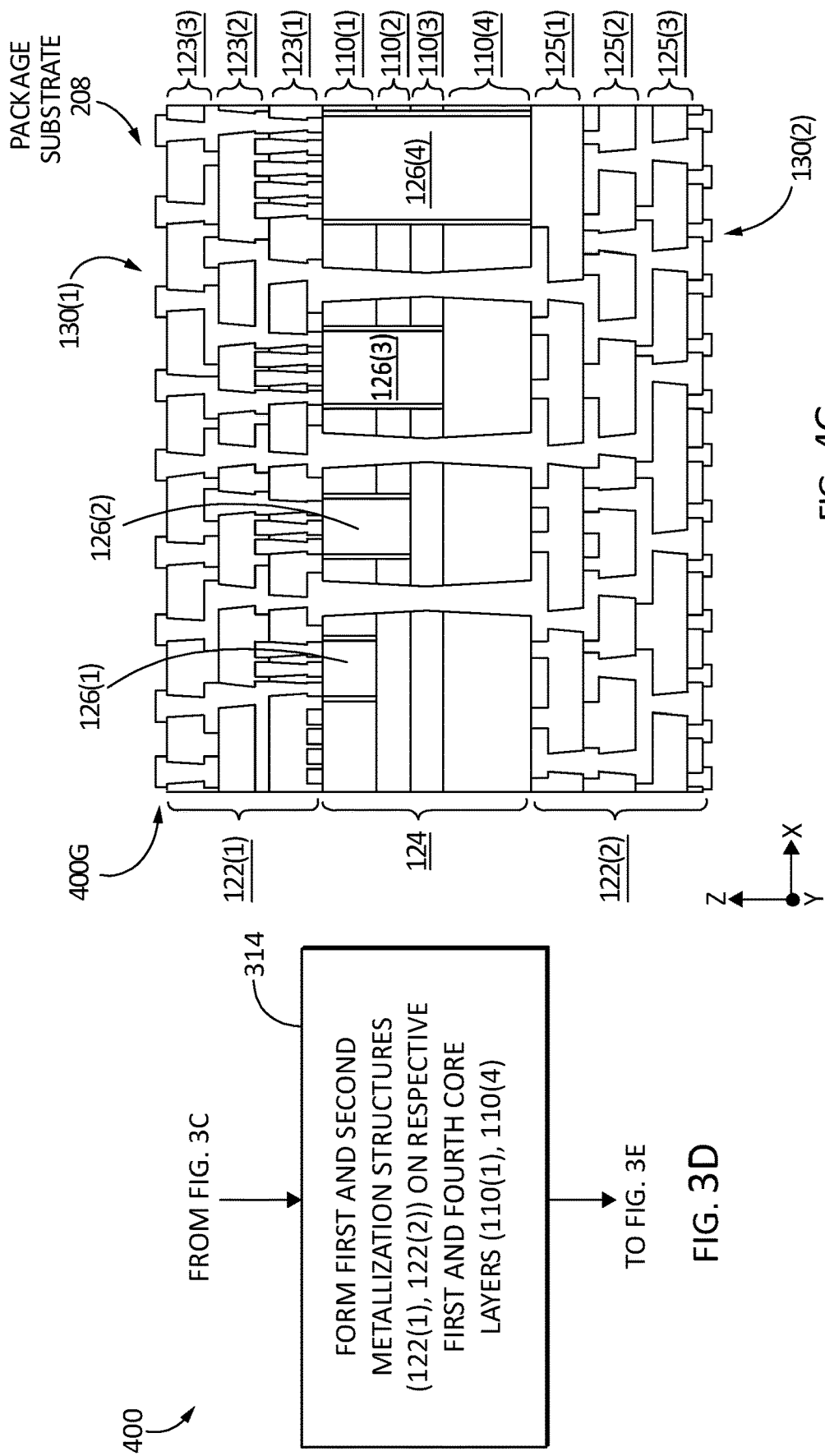

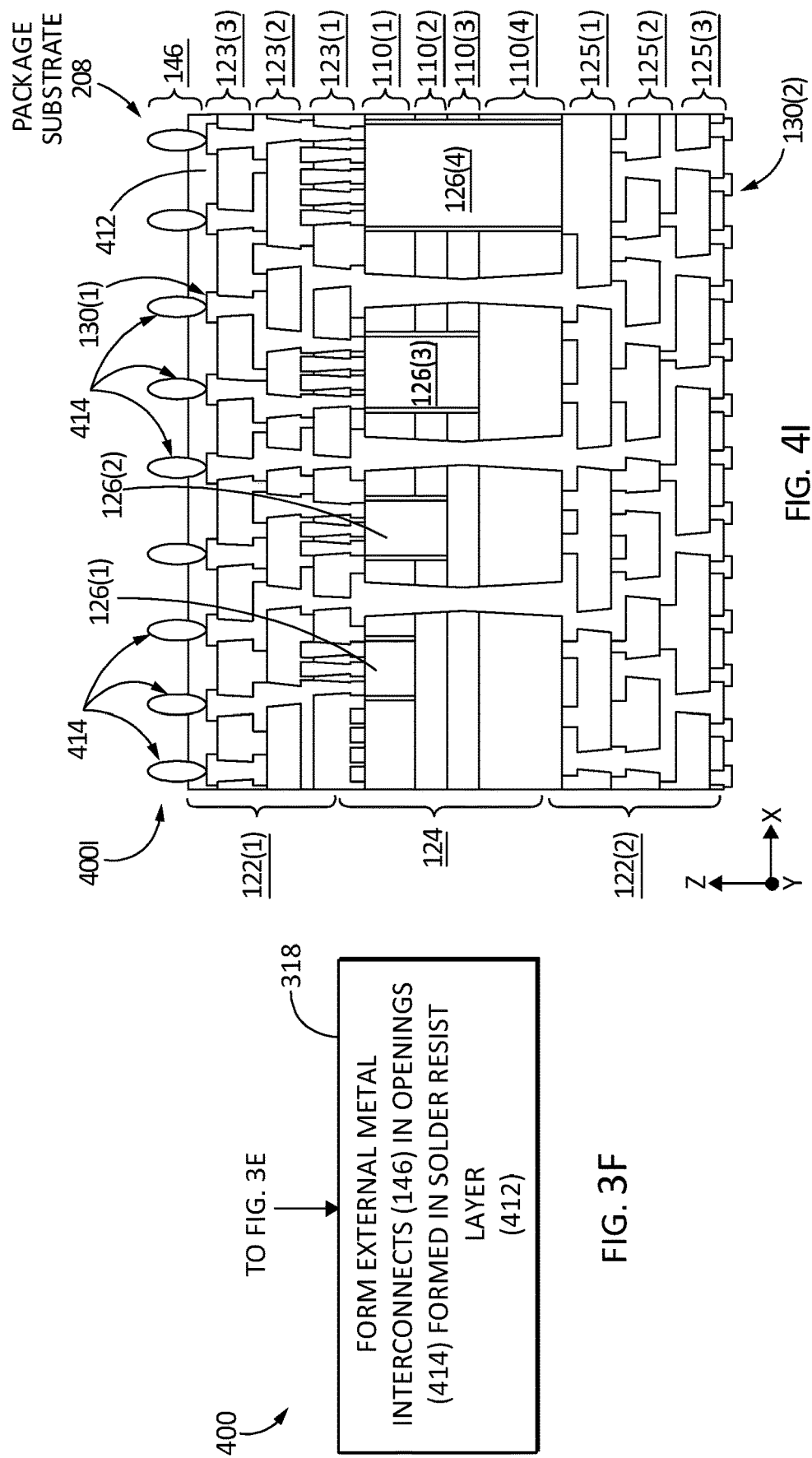

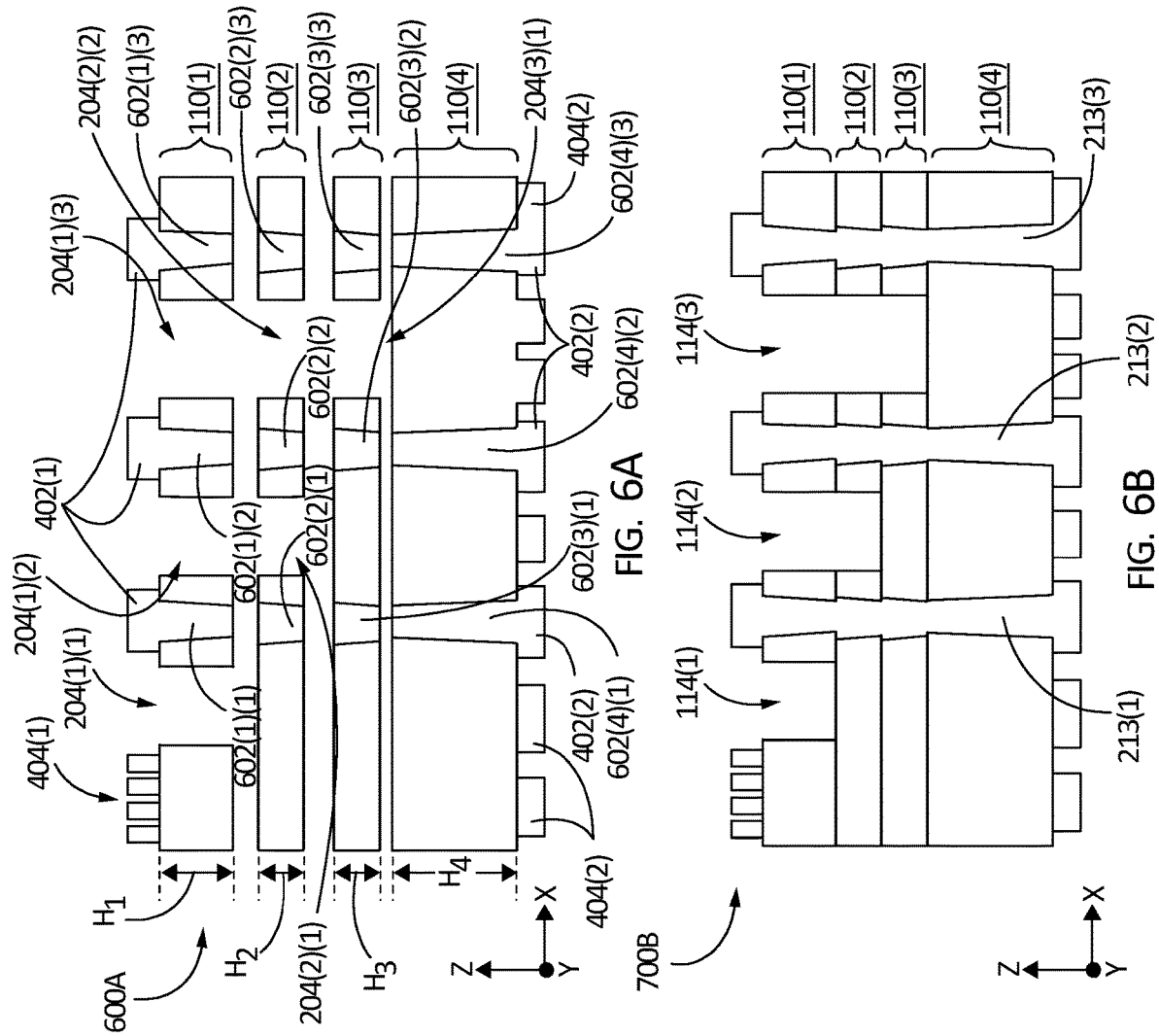

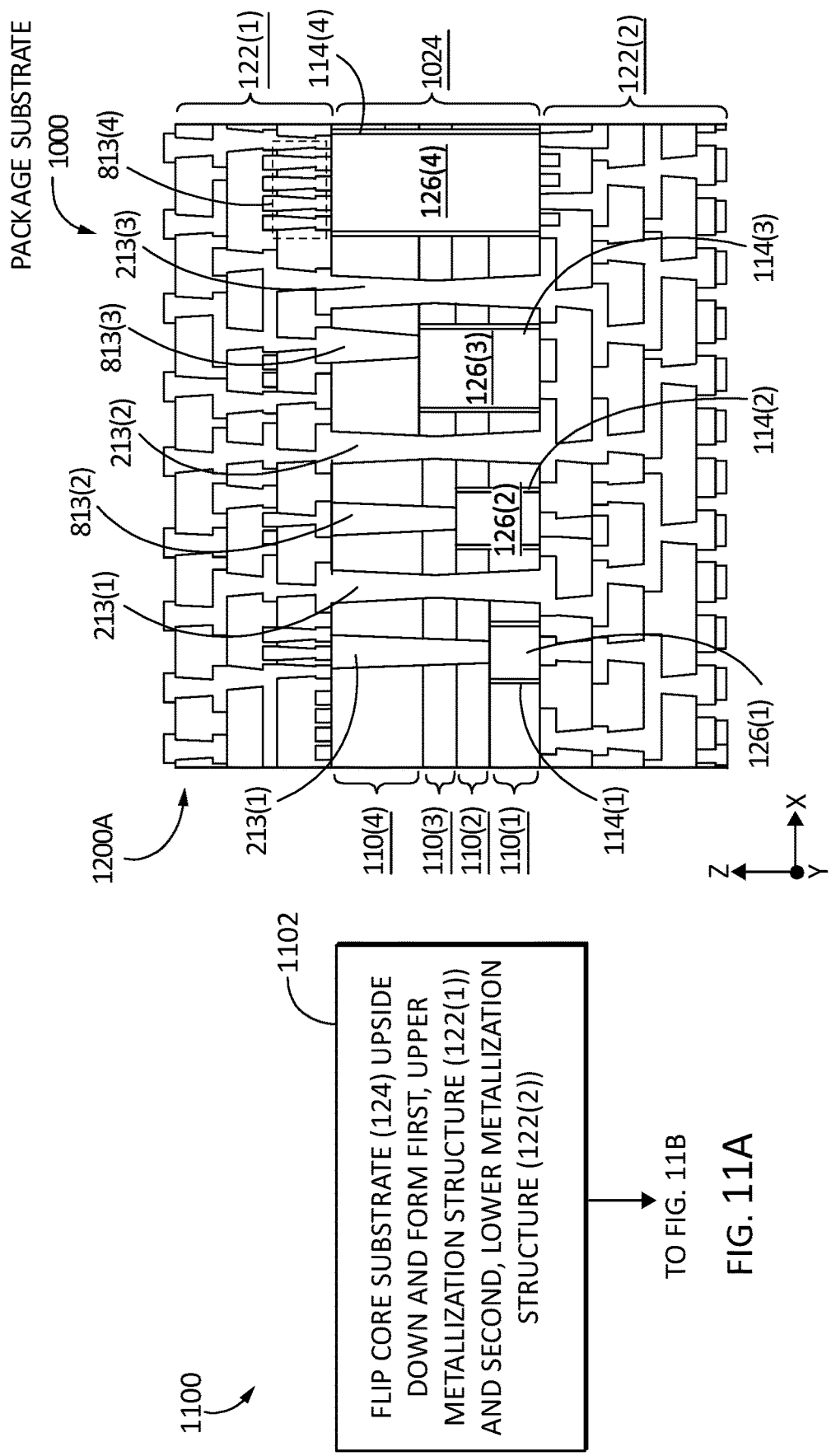

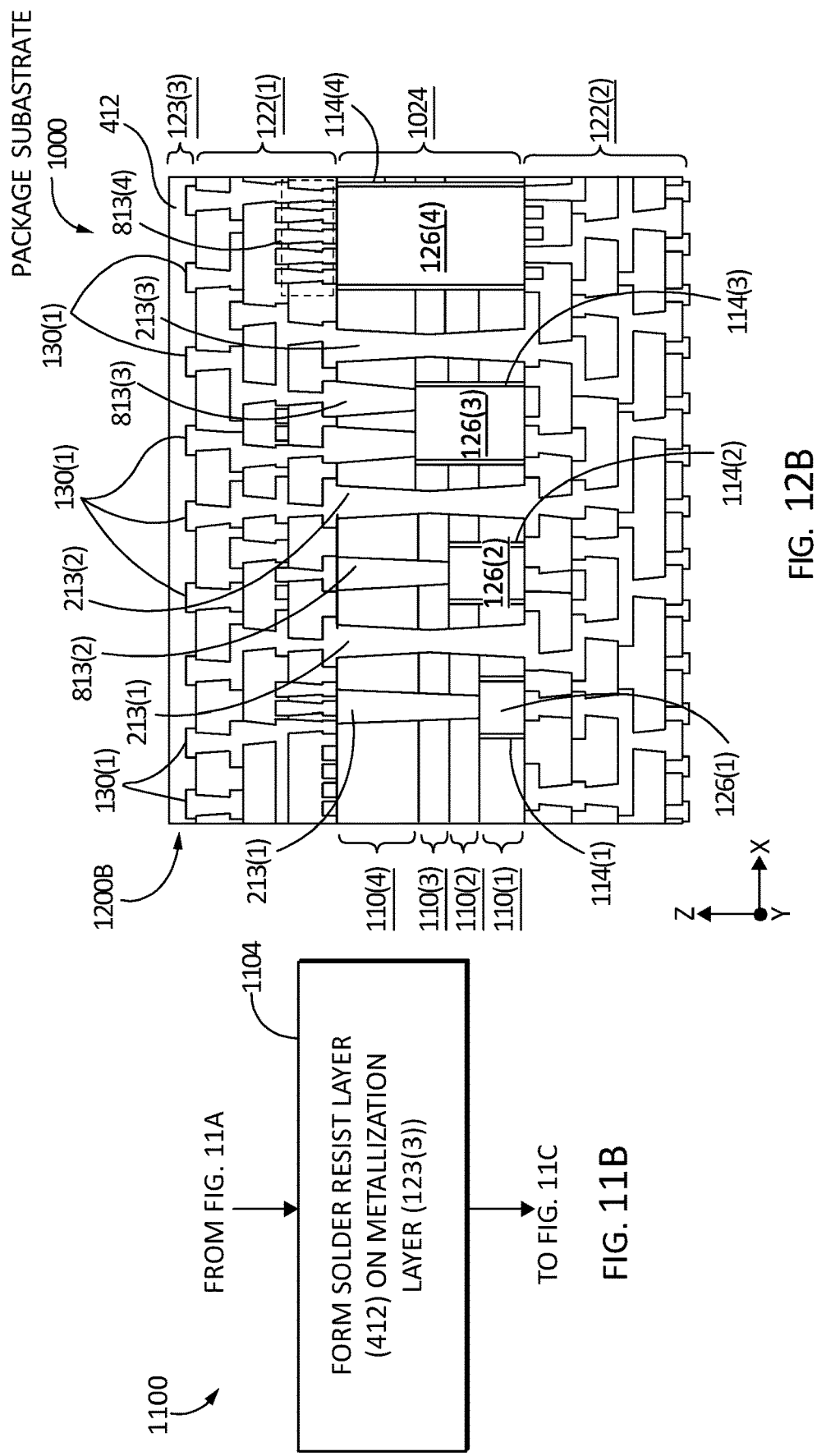

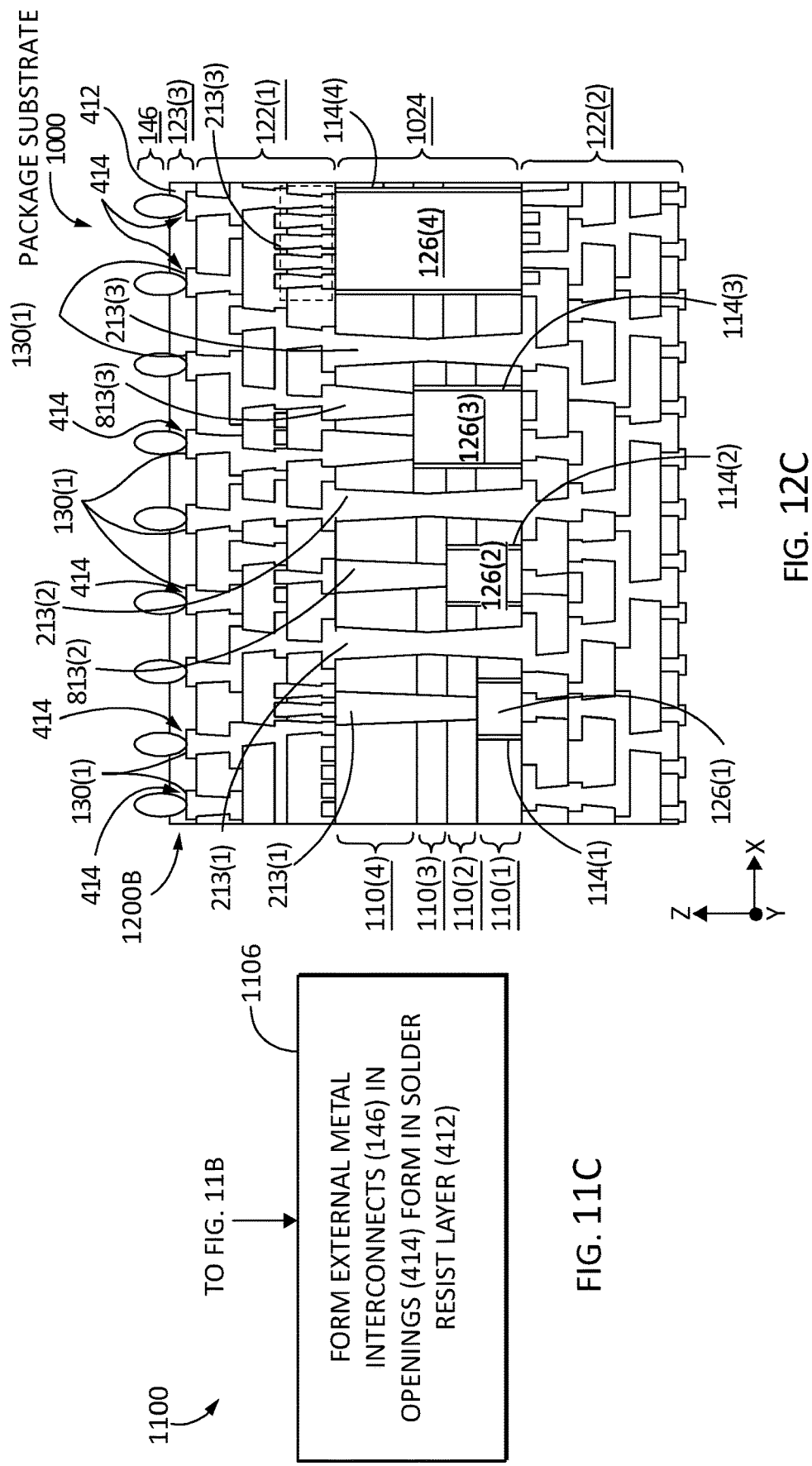

SUBSTRATE WITH MULTIPLE CORE LAYERS TO PROVIDE VARIED THICKNESS CAVITIES SUPPORTING VARIED THICKNESS EMBEDDED ELECTRICAL DEVICES, AND RELATED INTEGRATED CIRCUIT (IC) PACKAGES AND FABRICATION METHODS

BACKGROUND

I. Field of the Disclosure

The field of the disclosure relates to integrated circuit (IC) packages, and more particularly to design and fabrication of substrates (e.g., package substrates, interposer substrates) for an IC package, wherein the substrate includes a core layer to support embedded electrical devices in the package substrate and to strengthen the substrate to mitigate warpage.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that are mounted on and electrically coupled to a substrate as a routing substrate (e.g., a package substrate) to provide physical support and an electrical interface to the die(s). The die(s) is electrically interfaced to metal interconnects (e.g., metal traces) exposed in an upper layer of the substrate as part of signal routing paths. The substrate also includes one or more metallization layers that include metal interconnects (e.g., metal traces, metal lines) with vertical interconnect accesses (vias) coupling the metal interconnects together between adjacent metallization layers to provide electrical interfaces between the die(s). If the substrate is a package substrate, the substrate also includes a lower, outer metallization layer that includes metal interconnects coupled to external metal interconnects (e.g., ball grid array (BGA) interconnects) to provide an external interface between the die(s) in the IC package. The external metal interconnects can also be coupled (e.g., soldered) to traces in a printed circuit board (PCB) to attach the package to the PCB and interface its die(s) with the circuitry of the PCB.

Some substrates are cored substrates, meaning they include a core layer. A core layer is a centralized layer of the substrate that provides mechanical support and stability to the package substrate and the IC package incorporating the package substrate. For example, a core layer of a package substrate may be made of a reinforced polymer composite material, such as fiberglass or epoxy. The core layer is typically the thickest layer of the substrate and serves as the foundation layer upon which other metallization layers are built. An electrical device may also be embedded in the core layer of a package substrate to provide a desired function for the IC package. Embedding an electrical device in the core layer may serve to reduce the size of the IC package by advantageously consuming area in the core layer that is not otherwise used or needed for electrical signal routing. Embedding an electrical device in the core layer may also minimize the connection path length between the embedded electrical device and a coupled die in the IC package to minimize induction in the connection path. For example, a passive electrical device such as a deep trench capacitor (DTC) may be embedded in the core layer of the substrate to provide a decoupling capacitance for circuits in a die in the IC package to shunt noise from one electrical circuit (e.g., a power supply circuit) to another electrical circuit (e.g., a powered electrical circuit). As another example, a resistor or inductor may be embedded in the core layer. As yet another example, a power management IC may be embedded in the core layer as part of a power distribution network (PDN) in the IC package.

SUMMARY OF THE DISCLOSURE

Aspects disclosed herein include a substrate with multiple core layers to provide varied thickness cavities supporting varied thickness embedded electrical devices. Related integrated circuit (IC) packages and fabrication methods are also disclosed. The substrate is designed to be included in an IC package to support a semiconductor die ("die") and/or other circuits and to provide signal routing paths to the die and/or other circuits as a routing substrate. As an example, the substrate can be a package substrate that provides signal routing paths to the die(s) and/or other circuits and external metal interconnects for external signal routing. As another example, the substrate can be an interposer substrate that provides signal routing paths between multiple die layers, such as in a three-dimensional IC (3DIC) package. The substrate includes a core layer to provide mechanical stability to the substrate and/or an IC package incorporating the substrate to mitigate warpage. It may be desired to embed multiple electrical devices (e.g., a deep trench capacitor (DTC), inductor, resistor) in the core layer to conserve other areas of the IC package, especially as the number of electrical devices needed in IC package increases. However, it may not be possible for the thickness of the core layer to be compatible for embedding multiple electrical devices of different thicknesses in the core layer. To fully embed an electrical device in the core layer, the core layer needs to have sufficient thickness to allow a cavity to be formed therein to support the thickness of the embedded electrical device. However, if the core layer is thicker than an electrical device to be embedded in the core layer, the cavity formed in the core layer to support the embedded electrical device will be deeper than the thickness of the electrical device. This causes the external metal interconnects of the electrical device sitting in the cavity in the core layer to be located below the opening of the cavity such that metal interconnects in an adjacent metallization layer of the substrate cannot be directly coupled to the electrical device.

In this regard, in exemplary aspects, to provide for the core layer of the substrate to support multiple embedded electrical devices, multiple core layers are provided in the substrate. Providing multiple core layers in the substrate allows multiple cavities to be formed in the core layers at multiple depths to compatibly support embedding multiple electrical devices of varied thicknesses in the core layers. As a non-limiting example, a first cavity of a desired depth can be formed by two (2) openings in two (2) different core layers whose total thickness equals the desired cavity depth. Thus, when these openings are aligned when the two (2) core layers are coupled to each other, a single cavity is formed from the aligned openings of the two (2) core layers that is the depth of the combined thicknesses of the two (2) core layers. However, as another example, by providing the multiple core layers, another second cavity can also be formed in only one (1) of the core layers so that the second cavity is the thickness of that single core layer. Thus, providing multiple core layers in the substrate can compatibly support forming cavities of multiple thicknesses that are compatible with multiple electrical devices of different thicknesses to be embedded either partially or fully therein. In this manner, design parameter of the overall thickness of the core layer of a substrate can be independent of the variation in thicknesses of multiple embedded electrical devices desired to be embedded either partially or fully therein. Thus, there is not an unacceptable tradeoff required in the thickness of the core layers to provide the desired mechanical support while also supporting the ability to compatibly embed multiple electrical devices of different thicknesses in the core layers.

In this regard, in one exemplary aspect, a substrate is provided. The substrate comprises a first metallization structure comprising one or more first metallization layers. The substrate also comprises a second metallization structure comprising one or more second metallization layers. The substrate also comprises a core substrate between the first metallization structure and the second metallization structure in a first direction. The core substrate comprises a first core layer having a first thickness in the first direction. The core substrate also comprises a second core layer coupled to the first core layer and at least partially parallel to the first core layer in a second direction orthogonal to the first direction, the second core layer having a second thickness. The substrate also comprises a first cavity in the first core layer, the first cavity having the first thickness in the first direction. The substrate also comprises a second cavity in the first core layer and the second core layer, the second cavity having a third thickness in the first direction of at least the first thickness and the second thickness.

In another exemplary aspect, a method of fabricating a substrate is provided. The method comprises forming a core substrate. Forming the core substrate comprises forming a first core layer having a first thickness in a first direction. Forming the core substrate also comprises forming a first cavity in the first core layer, the first cavity having the first thickness in the first direction. Forming the core substrate also comprises forming a first opening of a second cavity in the first core layer, the first opening of the second cavity having the first thickness in the first direction. Forming the core substrate also comprises forming a second core layer having a second thickness in the first direction. Forming the core substrate also comprises forming a second opening of the second cavity in the second core layer, the second opening of the second cavity having the second thickness in the first direction. The method also comprises coupling the second core layer to the first core layer, such that the second core layer is at least partially parallel to the first core layer in a second direction orthogonal to the first direction, and the first opening of the second cavity is aligned with the second opening of the second cavity in the first direction to create the second cavity having a third thickness in the first direction of at least the first thickness and the second thickness. The method also comprises coupling a first metallization structure comprising one or more first metallization layers to the first core layer. The method also comprises coupling a second metallization structure comprising one or more second metallization layers to the second core layer, such that the core substrate is between the first metallization structure and the second metallization structure in the first direction.

BRIEF DESCRIPTION OF THE FIGURES

FIGS. 3A, 3B, 3C, 3D, 3E, and 3F are a flowchart illustrating an exemplary fabrication process of fabricating a substrate that includes multiple core layers with multiple cavities formed at multiple thicknesses and supporting multiple electrical devices embedded either partially or fully therein, including, but not limited to, the substrates in FIGS. 1 and FIGS. 2A and 2B;

FIGS. 4A, 4B, 4C, 4D, 4E, 4F, 4G, 4H, and 4I are exemplary fabrication stages during fabrication of the substrate according to the fabrication process in FIGS. 3A, 3B, 3C, 3D, 3E, and 3F;

FIG. 5 is a flowchart illustrating alternative process steps for certain process steps in the fabrication process in FIGS. 3A and 3B;

FIGS. 6A and 6B are exemplary fabrication stages for the alternative process steps in FIG. 5;

FIGS. 11A, 11B, and 11C are a flowchart illustrating alternative process steps for certain process steps in the fabrication process in FIGS. 3G, 3H, and 3I;

FIGS. 12A, 12B, and 12C are exemplary fabrication stages during fabrication of the substrate according to the fabrication process in FIGS. 11A, 11B, and 11C;

DETAILED DESCRIPTION

Figure 1:
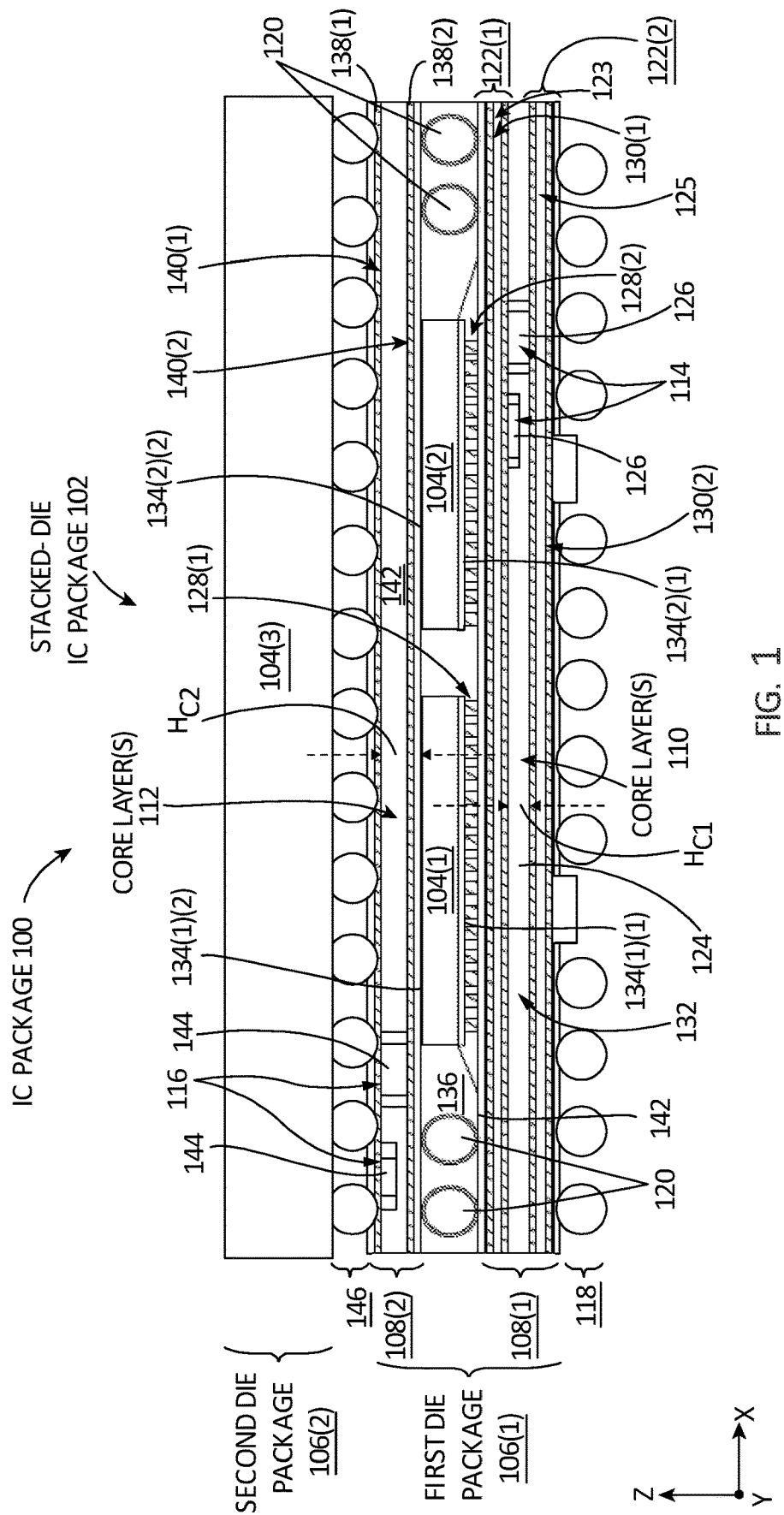
FIG. 1 is a side view of an exemplary package-on-package (POP) integrated circuit (IC) package that includes a first die package coupled to a first substrate as a package substrate, and a second die package stacked vertically above the first die package and coupled to the package substrate through an intervening second substrate as an interposer substrate, wherein the substrate(s) includes multiple core layers with multiple cavities formed at multiple depths to compatibly support embedding multiple electrical devices of varied thicknesses in such core layers.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein a substrate with multiple core layers to provide varied thickness cavities supporting varied thickness embedded electrical devices. Related integrated circuit (IC) packages and fabrication methods are also disclosed. The substrate is designed to be included in an IC package to support a semiconductor die ("die") and/or other circuits and to provide signal routing paths to the die and/or other circuits as a routing substrate. As an example, the substrate can be a package substrate that provides signal routing paths to the die(s) and/or other circuits and external metal interconnects for external signal routing. As another example, the substrate can be an interposer substrate that provides signal routing paths between multiple die layers, such as in a three-dimensional IC (3DIC) package. The substrate includes a core layer to provide mechanical stability to the substrate and/or an IC package incorporating the substrate to mitigate warpage. It may be desired to embed multiple electrical devices (e.g., a deep trench capacitor (DTC), inductor, resistor) in the core layer to conserve other areas of the IC package, especially as the number of electrical devices needed in IC package increases. However, it may not be possible for the thickness of the core layer to be compatible for embedding multiple electrical devices of different thicknesses in the core layer. To fully embed an electrical device in the core layer, the core layer needs to have sufficient thickness to allow a cavity to be formed therein to support the thickness of the embedded electrical device. However, if the core layer is thicker than an electrical device to be embedded in the core layer, the cavity formed in the core layer to support the embedded electrical device will be deeper than the thickness of the electrical device. This causes the external metal interconnects of the electrical device sitting in the cavity in the core layer will be located below the opening of the cavity such that metal interconnects in an adjacent metallization layer of the substrate cannot be directly coupled to the electrical device.

In this regard, in exemplary aspects, to provide for core layer of the substrate to support multiple embedded electrical devices, multiple core layers are provided in the substrate. Providing multiple core layers in the substrate allows multiple cavities to be formed in the core layers at multiple depths to compatibly support embedding of multiple electrical devices of varied thicknesses in the core layers. As a non-limiting example, a first cavity of a desired depth can be formed by two (2) openings in two (2) different core layers whose total thicknesses equal the desired cavity depth. Thus, when these openings are aligned when the two (2) core layers are coupled to each other, a single cavity is formed from the aligned openings of the two (2) core layers that is the depth of the combined thicknesses of the two (2) core layers. However, as another example, by providing the multiple core layers, another second cavity can also be formed in only one (1) of the core layers so that the second cavity is the thickness of that single core layer. Thus, providing multiple core layers in the substrate can compatibly support forming cavities of multiple thicknesses that are compatible with multiple electrical devices of different thicknesses to be embedded either partially or fully therein. In this manner, design parameter of the overall thickness of the core layer of a substrate can be independent of the variation in thicknesses of multiple embedded electrical devices desired to be embedded either partially or fully therein. Thus, there is not an unacceptable tradeoff required in the thickness of the core layers to provide the desired mechanical support while also supporting the ability to compatibly embed multiple electrical devices of different thicknesses in the core layers.

In this regard, FIG. 1 is a side view an exemplary package-on-package (POP) integrated circuit (IC) package 100 that is a three-dimensional (3D) IC (3DIC) package, also referred to herein as IC package 100. The IC package 100 in this example is a stacked-die IC package 102 that includes first, second, and third semiconductor dies ("dies") 104(1), 104(2), 104(3) in respective first and second die packages 106(1), 106(2) packages stacked on top of and coupled to each other in a first, vertical direction (Z-axis direction). As discussed in more detail below, the IC package 100 includes first and second routing substrates 108(1), 108(2) as substrates 108(1), 108(2) of which any can include multiple core layers 110, 112 each with respective multiple cavities 114, 116 formed in such core layers 110, 112 at multiple depths in the first, vertical direction (Z-axis direction) to compatibly support embedding multiple electrical devices of varied thicknesses in such core layers. A "routing substrate" as used herein is a nomenclature to refer to a substrate that has one or more metallization layers wherein metal interconnects can be formed therein to provide signal routing paths.

With continuing reference to FIG. 1, the first die package 106(1) is coupled to the first routing substrate 108(1) as a package substrate 108(1). The package substrate 108(1) provides electrical signal routing paths to external metal interconnects 118 (e.g., ball grid array (BGA) interconnects) to provide an external electrical interface to the dies 104 (1)-104(3) of the IC package 100. The first die 104(1) and second die 104(2) are electrically coupled to the external metal interconnects 118 through electrical signal routing paths in the package substrate 108(1). The third die 104(3) is electrically coupled to the first die 104(1), the second die 104(2), and/or the external metal interconnects 118 by being coupled to the second routing substrate 108(2) as an interposer substrate 108(2). The interposer substrate 108(2) includes electrical signal routing paths between the third die 104(3) and the package substrate 108(1) through vertical interconnects 120 (e.g., metal balls). The package substrate 108(1) also includes electrical signal routing paths that electrically couple the first die 104(1) and/or the second die 104(2), to the third die 104(3) through the vertical interconnects 120 and the interposer substrate 108(2), and to the external metal interconnects 118 (e.g., metal lines, metal traces).

In this example, the package substrate 108(1) includes a first, upper metallization structure 122(1) disposed on a core substrate 124 that includes the multiple core layers 110 that include the multiple cavities 114 for supporting embedded electrical devices 126 therein. The multiple cavities 114 can support either the full or partial embedding of electrical devices 126 therein. The first, upper metallization structure 122(1) is a structure that includes one or more metallization layers 123 that include one or more metal layers insulated by insulating layers. Examples of electrical devices 126 that can be embedded either partially or fully in the cavities 114 include, but are not limited to, a capacitor (e.g., a deep trench capacitor (DTC)) a resistor, an inductor, and an IC including an IC provided in a die. The core substrate 124 is disposed on a second, lower metallization structure 122(2) of the package substrate 108(1), between the second, lower metallization structure 122(2) and the first, upper metallization structure 122(1) in the first, vertical direction (Z-axis direction). The second, lower metallization structure 122(2) is a structure that includes one or more metallization layers 125 that include one or more metal layers insulated by insulating layers. The first, upper and second, lower metallization structures 122(1), 122(2) are parallel to each other in second directions (X-axis and Y-axis directions), orthogonal to the first, vertical direction (Z-axis direction). However, the first, upper and second, lower metallization structures 122(1), 122(2) could also be only partially parallel to each other. The first, upper metallization structure 122(1) provides an electrical interface for signal routing to the first die 104(1), the second die 104(2), and the vertical interconnects 120. The first die 104(1) and the second die 104(2) are coupled to respective die interconnects 128(1), 128(2) (e.g., raised metal bumps) that are electrically coupled to first metal interconnects 130(1) (e.g., metal lines, metal traces) in the first, upper metallization structure 122(1). The first metal interconnects 130(1) in the first, upper metallization structure 122(1) are coupled to metal interconnects 132 in the core substrate 124, which are coupled to second metal interconnects 130(2) (e.g., metal lines, metal traces) in the second, lower metallization structure 122(2). In this manner, the package substrate 108(1) provides interconnections between its first, upper and second, lower metallization structures 122(1), 122(2), and the core substrate 124 to provide signal routing to the first die 104(1). The external metal interconnects 118 are coupled to the second metal interconnects 130(2) in the second, lower metallization structure 122(1) to provide interconnections through the package substrate 108(1) to the first die 104(1) and the second die 104(2) through the die interconnects 128. In this example, first, active sides 134(1)(1), 134(2)(1) of the respective first die 104(1) and second die 104(1) are adjacent to and coupled to the package substrate 108(1), and more specifically to the first, upper metallization structure 122(1) of the package substrate 108(1).

In the example IC package 100 in FIG. 1, an additional, optional second die package 106(2) is provided and coupled to the first die package 106(1) to support multiple dies. For example, the first die 104(1) and/or the second die 104(2) in the first die package 106(1) may include an application processor, and the third die 104(3) may be a memory die, such as a dynamic random access memory (DRAM) die that provides memory support for the application processor. In this regard, in this example, the first die package 106(1) also includes the interposer substrate 108(2) that is disposed on a package mold 136 encasing the first die 104(1) and the second die 104(2), adjacent to respective second, inactive sides 134(1)(2), 134(2)(2) of the respective first die 104(1) and second die 104(2). The interposer substrate 108(2) also includes a first, upper metallization layer 138(1) and a second, lower metallization layer 138(2) that each include respective first and second metal interconnects 140(1), 140(2) (e.g., metal lines, metal traces) to provide interconnections to the third die 104(3) in the second die package 106(2). In this example, the interposer substrate 108(1) includes a core substrate 142 disposed on the second, lower metallization layer 138(1) of the interposer substrate 108(2), between the first, upper metallization layer 138(1) and the second, lower metallization layer 138(2) in the first, vertical direction (Z-axis direction). The first, upper and second, lower metallization layers 138(1), 138(2) are parallel to each other in the second directions (X-axis and Y-axis directions), orthogonal to the first, vertical direction (Z-axis direction). However, the first, upper and second, lower metallization layers 138(1), 138(2) could also be only partially parallel to each other. As discussed in more detail below, in this example, the core substrate 142 can also include the multiple core layers 112 that include the multiple cavities 116 for supporting embedded electrical devices 144 therein. The second die package 106(2) is physically and electrically coupled to the first die package 106(1) by being coupled through external metal interconnects 146 (e.g., solder bumps, BGA interconnects) to the interposer substrate 108(2). The external metal interconnects 146 are coupled to the first metal interconnects 140(1) in the first, upper metallization layer 138(1) of interposer substrate 108(2), which are coupled to the second metal interconnects 140(2) in the second, lower metallization layer 138(2) and the vertical interconnects 120, to couple the third die 104(3) to the package substrate 108(1).

It may be desired for the thickness $H_{C1}$ of the core substrate 124 in the package substrate 108(1) in the first, vertical direction (Z-axis direction) and the thicknesses of the respective electrical devices 126 embedded therein to be compatible. For example, the thickness $H_{C1}$ of the core substrate 124 can be based on the thickness of the embedded electrical devices 126 so that the depth of the cavities 114 formed in the core substrate 124 is sufficiently deep in the first, vertical direction (Z-axis direction) to support the thickness of the embedded electrical devices 126 to be able to fully embed the electrical devices 126 therein. The depth of the cavities 114 can also be designed so that when the electrical devices 126 are embedded in their respective cavities 114, external metal interconnects of the electrical devices 126 are oriented at an outer surface(s) of the core substrate 124 to then be interconnected to the first metal interconnects 130(1) in the adjacent first, upper metallization structure 122(1) for signal routing with the electrical devices 126. This is because the fabrication method used to fabricate the cavities 114 in the core substrate 124 may involve forming an opening (e.g., drilling) through the entire thickness $H_{C1}$ of the core substrate 124 such that the overall thickness $H_{C1}$ of the core substrate 124 defines the depth of the cavities 114 formed therein to support the embedded electrical devices 126. Thus, if the core substrate thickness $H_{C1}$ is much greater than the thickness of the embedded electrical devices 126, additional routing layers would be needed in the core substrate 124 to bridge a routing gap to the electrical devices 126 embedded within a deeper cavity in the core substrate 124. However, designing the thickness $H_{C1}$ of the core substrate 124 based on the thickness of the embedded electrical devices 126 may mean that the thickness $H_{C1}$ of the core substrate 124 is not sufficiently thick to mechanically support the IC package 100 to avoid or mitigate warpage.

Note also that the cavities 114 could also be formed so that an electrical device 126 can be partially embedded therein instead of fully embedded. In this example, the depth of the cavities 114 can also be designed so that when the electrical devices 126 are embedded in their respective cavities 114, external metal interconnects of the electrical devices 126 are oriented outside of the cavity 114 and extend beyond the outer surface(s) of the core substrate 124 to then be interconnected to the first metal interconnects 130(1) in the adjacent first, upper metallization structure 122(1) for signal routing with the electrical devices 126. This is because the fabrication method used to fabricate the cavities 114 in the core substrate 124 may involve forming an opening (e.g., drilling) through the entire thickness $H_{C1}$ of the core substrate 124 such that the overall thickness $H_{C1}$ of the core substrate 124 defines the depth of the cavities 114 formed therein to support the embedded electrical devices 126.

Similarly, with the interposer substrate 108(2) in the IC package 100 in this example also including cavities 116 with embedded electrical devices 144, it may also be desired for the thickness $H_{C2}$ of the core substrate 142 in the first, vertical direction (Z-axis direction) and the thicknesses of the respective electrical devices 144 embedded therein to be compatible. For example, the thickness $H_{C2}$ of the core substrate 142 can be based on the thickness of the embedded electrical devices 144 so that the depth of the cavities 116 formed in the core substrate 142 is sufficiently deep in the first, vertical direction (Z-axis direction) to support the thickness of the embedded electrical devices 144. The depth of the cavities 116 can also be designed so that when the electrical devices 144 are embedded in their respective cavities 116, external metal interconnects of the electrical devices 144 are oriented at an outer surface(s) of the core substrate 142 to then be interconnected to the second metal interconnects 140(2) in the adjacent second metallization layer 138(1) for signal routing with the electrical devices 144. This is because the fabrication method used to fabricate the cavities 116 in the core substrate 142 may involve forming an opening (e.g., drilling) through the entire thickness $H_{C2}$ of the core substrate 142 such that the overall thickness $H_{C2}$ of the core substrate 142 defines the depth of the cavities 116 formed therein to support the embedded electrical devices 144. Thus, if the core substrate thickness $H_{C2}$ is much greater than the thickness of the embedded electrical devices 144, additional routing layers would be needed in the core substrate 142 to bridge a routing gap to the electrical devices 144 embedded within a deeper cavity in the core substrate 142. However, designing the thickness $H_{C2}$ of the core substrate 142 based on the thickness of the embedded electrical devices 144 may mean that the thickness $H_{C2}$ of the core substrate 142 is not sufficiently thick to mechanically support the IC package 100 to avoid or mitigate warpage.

Again, note also that the cavities 116 could also be formed in the core substrate 142 so that an electrical device 144 can be partially embedded therein. In this example, the depth of the cavities 116 can also be designed so that when the electrical devices 144 are embedded in their respective cavities 116, external metal interconnects of the electrical devices 144 are oriented outside of the cavity 116 and extend beyond the outer surface(s) of the core substrate 142 to then be interconnected to the second metal interconnects 140(2) in the adjacent second metallization layer 138(1) for signal routing with the electrical devices 144.

Figure 2A:
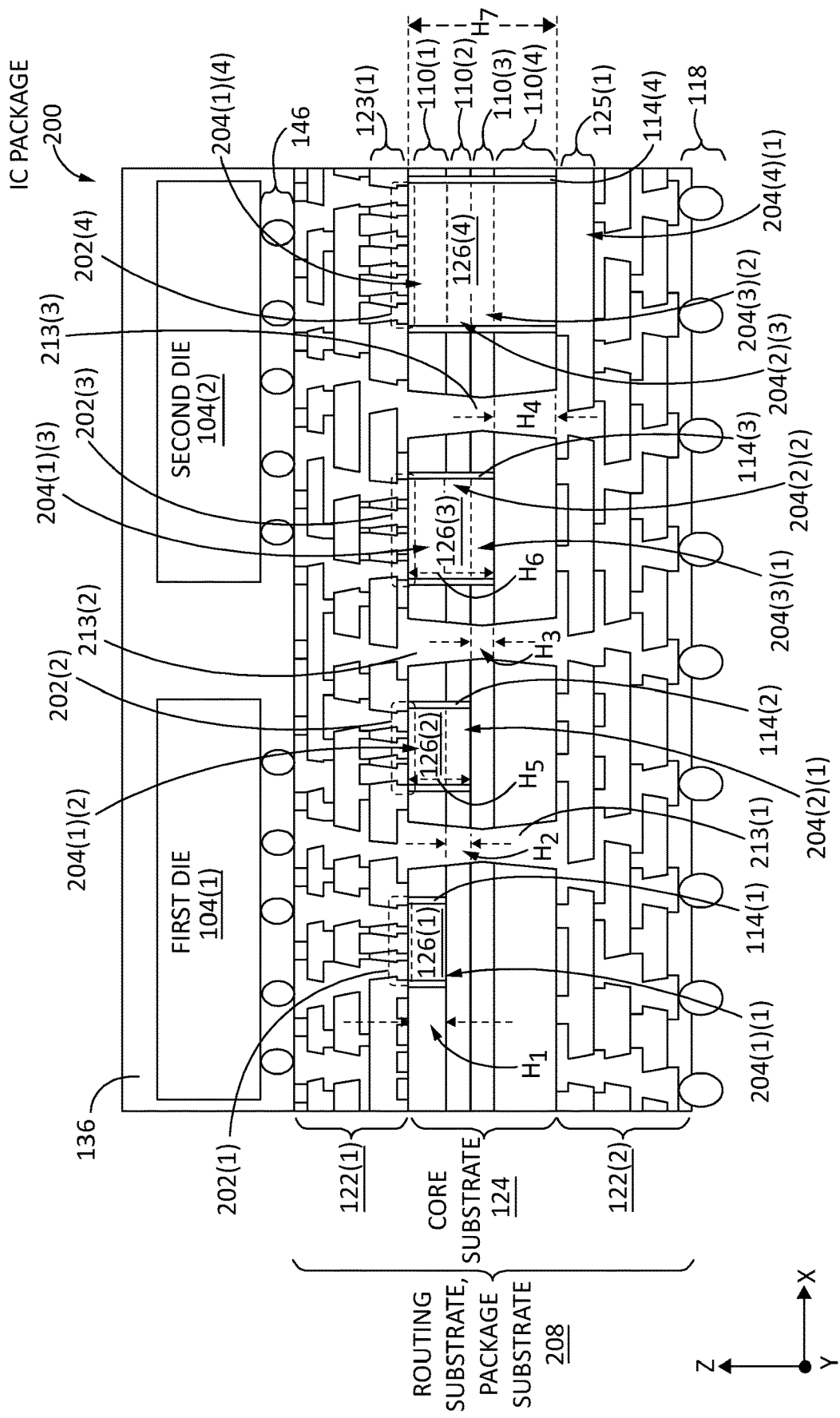
FIG. 2A is a side view of another exemplary IC package that includes a first die package coupled to a substrate as a package substrate, wherein the substrate(s) includes multiple core layers with multiple cavities formed at multiple depths and supporting multiple embedded electrical devices having front side signal routing to the substrate.

In this regard, FIG. 2A is a side view of another exemplary IC package 200 that includes a routing substrate 208 that is a substrate in the form of a package substrate 208 that includes multiple core layers 110(1)-110(4) each with respective cavities 114(1)-114(4) formed at multiple depths and each supporting a respective embedded electrical device 126(1)-126(4) having front side signal routing to the package substrate 208. The IC package 200 can be included as part of the IC package 100 in FIG. 1, as an example, wherein the package substrate 208 in the IC package 200 in FIG. 2A can be the package substrate 108(1) in the IC package 100 in FIG. 1. Also, the routing substrate 208 in the IC package 200 in FIG. 2A could also be the interposer substrate 108(2) in the IC package 100 in FIG. 1 as another example that includes the core substrate 142 and the first and second metallization layers 138(1), 138(2). However, the routing substrate 208 in FIG. 2A is discussed below by example as being the package substrate 108(1) in the IC package 100 in FIG. 1 for exemplary purposes only. Common components between the IC package 200 in FIG. 2A and the IC package 200 in FIG. 1 are shown with common element numbers.

As shown in FIG. 2A, in this example, the core substrate 124 includes multiple separate core layers 110(1)-110(4), which in this example are the first, second, third, and fourth core layers 110(1)-110(4). The core layers 110(1)-114(4) are coupled together in a first, vertical direction (Z-axis direction) to form the core substrate 124 as part of the package substrate 208. Metal posts 213(1)-213(3) (i.e., vertical interconnects) are formed through the core substrate 124 through the combined, coupled core layers 110(1)-114(4) to provide pass through signal routing paths between the first, upper and second, lower metallization structures 122(1), 122(2). In this example, the core layers 110(1)-110(4) are parallel to each other a second, horizontal direction (X- and Y-axes directions), but note that some or all of the core layers 110(1)-110(4) could also only be partially parallel to each other. The first, second, third, and fourth core layers 110(1)-110(4) each have respective first, second, third, and fourth cavities 114(1)-114(4) of respective thicknesses $H_1$, $H_2$, $H_3$, $H_4$ in the first, vertical direction (Z-axis direction) that are each configured to support a respective embedded electrical device 126(1)-126(4). The thicknesses $H_1$, $H_5$, $H_6$, $H_7$ of the respective cavities 114(1)-114(4) in the core layers 110(1)-110(4) in the first, vertical direction (Z-axis direction) are designed to be compatible with the thicknesses $H_1$, $H_5$, $H_6$, $H_7$ of the respective electrical devices 126(1)-126(4) in the first, vertical direction (Z-axis direction). This allows external metal interconnects 202(1)-202(4) of the respective electrical devices 126(1)-126(4) to be adjacent to the first metallization layer 123(1) of the first, upper metallization structure 122(1) when the electrical devices 126(1)-126(4) are disposed in and resting in their respective cavities 114(1)-114(4).

In this example, the thickness $H_1$ of the first cavity 114(1) is the thickness $H_1$ of the first core layer 110(1), which is also the thickness $H_1$ of the first electrical device 126(1). In this manner, the thickness $H_1$ of the first cavity 114(1) formed by a first opening 204(1)(1) in the first core layer 110(1), defined by the thickness $H_1$ of the first core layer 110(1), is compatible with the thickness $H_1$ of the first electrical device 126(1). However, because of the presence of the first core layer 110(1), additional separate core layers cannot be provided in the core substrate 124 that match the respective increased thicknesses $H_5$, $H_6$, $H_7$ of the second, third, and fourth electrical devices 126(2)-126(3) to also be embedded either partially or fully in the core substrate 124. In this regard, to provide for the second, third, and fourth cavities 114(2)-114(4) that are also compatible with the respective increased thicknesses $H_5$, $H_6$, $H_7$ of the second, third, and fourth electrical devices 126(2)-126(4) in the first, vertical direction (Z-axis direction), the core substrate 124 includes the additional, second, third, and fourth core layers 110(2)-110(4) that have respective thicknesses $H_2$, $H_3$, $H_4$. In this example, the thickness $H_2$ of the second core layer 110(2) adjacent to the first core layer 110(1) is selected such that when a second opening 204(2)(1) is formed through the second core layer 110(2) of thickness $H_2$ and aligned with a first opening 204(1)(2) of thickness $H_1$ formed in the first core layer 110(1), the second cavity 114(2) is formed.

Figure 2B:
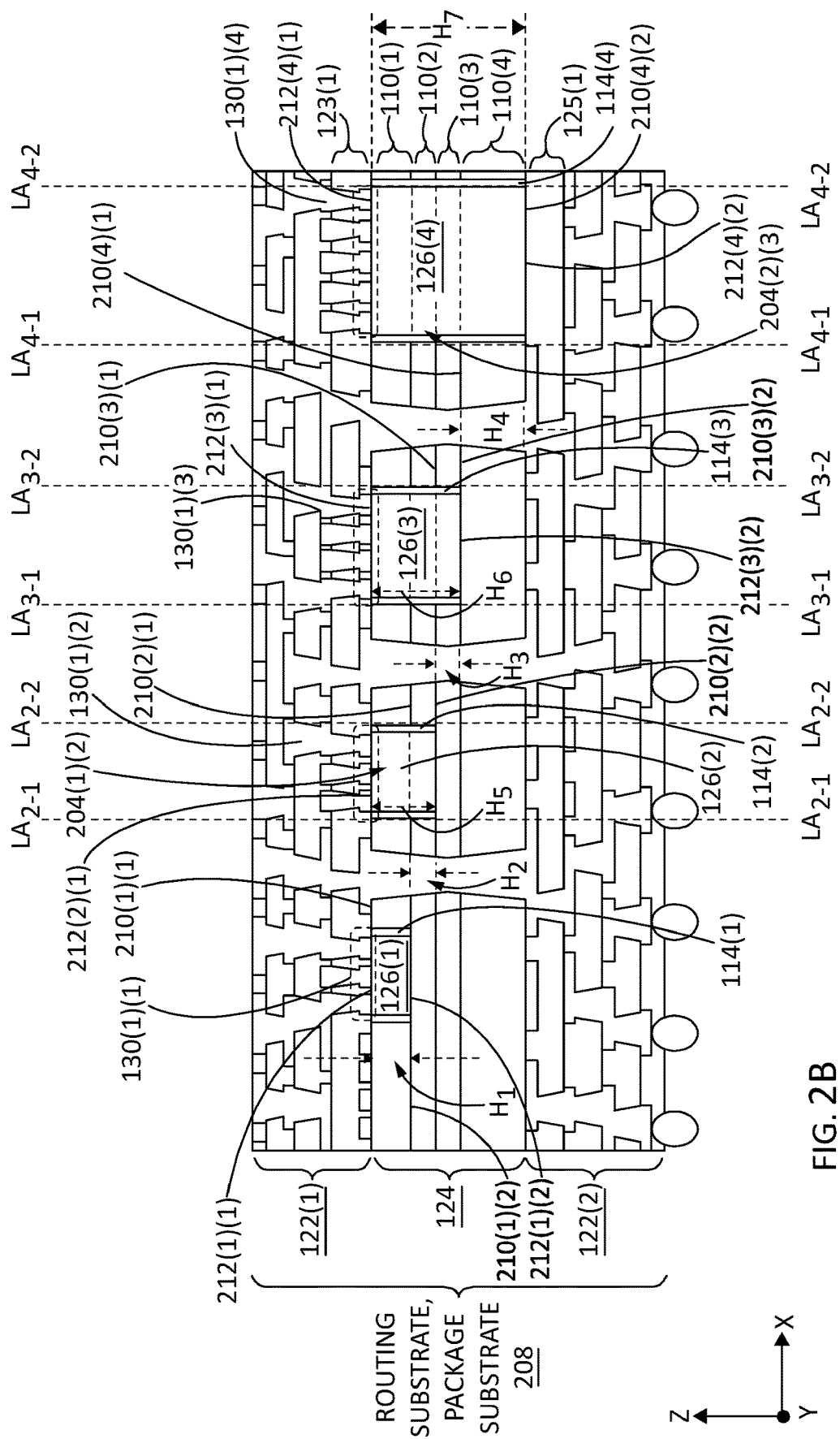
FIG. 2B is a side view of the substrate in FIG. 2A.

The second cavity 114(2) is formed when the first and second core layers 110(1), 110(2) are coupled together such that the combined thicknesses $H_1$, $H_2$ of the aligned first and second openings 204(1)(2), 204(2)(1) in the respective first and second core layers 110(1), 110(2) are compatible with the thickness $H_5$ of the second electrical device 126(2). In this example, the thickness $H_5$ of the second cavity 114(2) is the combined thicknesses $H_1$, $H_2$ of the first and second core layers 110(1), 110(2) when the first and second core layers 110(1), 110(2) are coupled and their first and second openings 204(1)(2), 204(2)(1) are aligned. This is shown in FIG. 2B by the vertical axes $LA_{2-1}$, $LA_{2-2}$ of the first opening 204(1)(2) and the second opening 204(2)(1) aligned with each other in the first, vertical direction (Z-axis direction). Note that the first and second openings 204(1)(2), 204(2)(1) for the second cavity 114(2) do not have to be fully aligned and could be partially aligned.

With continued reference to FIG. 2A, in this example, to provide for the third cavity 114(3) to also be compatible with the respective increased thickness $H_6$ of the third electrical device 126(3), the core substrate 124 includes an additional, third core layer 110(3) that has the thicknesses $H_3$ in the first, vertical direction (Z-axis direction) and is adjacent to the second core layer 110(2). In this example, the thickness $H_3$ of the third core layer 110(3) adjacent to the second core layer 110(2) is selected such that when second and third openings 204(2)(2), 204(3)(1) are formed through the respective second and third core layers 110(2), 110(3) of respective thicknesses $H_2$, $H_3$ and are aligned with another first opening 204(1)(3) of thickness $H_1$ formed in the first core layer 110(1), the third cavity 114(3) is formed. The third cavity 114(3) is formed when the first, second, and third core layers 110(1)-110(3) are coupled together such that the combined thicknesses $H_1$, $H_2$, $H_3$ of the aligned, first, second, and third openings 204(1)(3), 204(2)(2), 204(3)(1) in the respective first, second, and third core layers 110(1)-110(3) are compatible with the thickness $H_6$ of the third electrical device 126(3). In this example, the thickness $H_6$ of the third cavity 114(3) is the combined thicknesses $H_1$, $H_2$, $H_3$ of the first, second, and third core layers 110(1)-110(3) when coupled and their first, second, and third openings 204(1)(3), 204(2)(2), 204(3)(1) are aligned. This is shown in FIG. 2B by the vertical axes $LA_{3-1}$, $LA_{3-2}$ of the first, second, and third openings 204(1)(3), 204(2)(2), 204(3)(1) aligned with each other in the first, vertical direction (Z-axis direction). Note that the first, second, and third openings 204(1)(3), 204(2)(2), 204(3)(1) for the third cavity 114(3) do not have to be fully aligned and could be partially aligned.

With continued reference to FIG. 2A, in this example, to provide for the fourth cavity 114(4) to also be compatible with the respective increased thickness $H_7$ of the fourth electrical device 126(4), the core substrate 124 includes an additional, fourth core layer 110(4) that has the thicknesses $H_4$ in the first, vertical direction (Z-axis direction) and is adjacent to the third core layer 110(4). In this example, the thickness $H_4$ of the fourth core layer 110(4) is selected such that when second, third, and fourth openings 204(2)(3), 204(3)(2), 204(4)(1) are formed through the respective second, third, and fourth third core layers 110(2)-110(4) of respective thicknesses $H_2$, $H_3$ and aligned with another first opening 204(1)(4) of thickness $H_1$ formed in the first core layer 110(1), the fourth cavity 114(4) is formed. The fourth cavity 114(4) is formed when the first, second, third, and fourth core layers 110(1)-110(4) are coupled together such that the combined thicknesses $H_1$, $H_2$, $H_3$, $H_4$ of the aligned, first, second, third, and fourth openings 204(1)(4), 204(2)(3), 204(3)(2), 204(4)(1) in the respective first, second, third, and fourth core layers 110(1)-110(4) are compatible with the thickness $H_7$ of the fourth electrical device 126(4). In this example, the thickness $H_7$ of the fourth cavity 114(4) is the combined thicknesses $H_1$, $H_2$, $H_3$, $H_4$ of the first, second, third, and fourth core layers 110(1)-110(4) when coupled and their first, second, third, and fourth openings 204(1)(4), 204(2)(3), 204(3)(2), 204(4)(1) are aligned. This is shown in FIG. 2B by the vertical axes $LA_{4-1}$, $LA_{4-2}$ of the first, second, third, and fourth openings 204(1)(4), 204(2)(3), 204(3)(2), 204(4)(1) aligned with each other in the first, vertical direction (Z-axis direction). Note that the first, second, third, and fourth openings 204(1)(4), 204(2)(3), 204(3)(2), 204(4)(1) for the fourth cavity 114(4) do not have to be fully aligned and could be partially aligned.

Otherwise, if a single core layer were provided in the core substrate 124 in the IC package 200 in FIGS. 2A and 2B, the cavities 114(1)-114(4) may have to be formed at the same thicknesses $H_1$ of the core substrate 124. This would then not make it possible to support the electrical devices 126(2)-126(4) of reduced thicknesses $H_2$, $H_3$, $H_4$ over the thickness $H_1$ of the core substrate 124 without requiring additional routing layers to be provided in the core substrate 124 to bridge the routing gap between the reduced thickness electrical devices 126(2)-126(4) and the first, upper metallization structure 122(1). Alternatively, the thickness $H_1$ of the core substrate 124 provided as a single core layer could be reduced to try to accommodate reduced thickness electrical devices 126(2), for example, but then the reduced thickness electrical devices 126(3), 126(4) would still have the same routing gap. Further, the electrical device 126(1) of thickness $H_1$ could not be fully embedded in the core substrate 124 thus consuming routing area in the first, upper metallization structure 122(1). Reducing the thickness $H_1$ of the core substrate 124 may also be incompatible with the desired or required thickness to mechanically support the package substrate 208 to mitigate or prevent warpage of the package substrate 208. However, as discussed above, by providing the core substrate 124 as the multiple core layers 110(1)-110(4), the thicknesses $H_1$, $H_2$, $H_3$, $H_4$ of the core layers 110(1)-110(4) can be strategically defined and fabricated such that openings formed through the core layers 110(1)-110(4) when separated can be aligned to provide the multiple cavities 114(1)-114(4) of the different thicknesses (i.e., depths) of thicknesses $H_1$, $H_5$, $H_6$, $H_7$. Thus, a single cavity thickness will not have to be imposed on the core substrate 124 and the package substrate 208.

Note that the thicknesses $H_1$, $H_2$, $H_3$, $H_4$ of any of the core layers 110(1)-110(4) in the core substrate 124 can be the same or different thicknesses. The thicknesses $H_1$, $H_2$, $H_3$, $H_4$ of any of the core layers 110(1)-110(4) are selected based on the ability to form cavities of desired thicknesses $H_1$, $H_5$, $H_6$, $H_7$ in the core substrate 124. For example, thicknesses $H_1$, $H_2$, $H_3$, $H_4$ of any of the core layers 110(1)-110(4) could all be the same thicknesses so that four (4) different types of cavities could be formed in the core substrate 124 as whole, positive integer increments 1×, 2×, 3×, and 4× of the thickness $H_1$ of all the core layers 110(1)-110(4). As another example, the thicknesses $H_1$, $H_2$, $H_3$, $H_4$ of all of the core layers 110(1)-110(4) could all be different thicknesses so that four (4) different types of cavities could be formed in the core substrate 124 of non-linear thicknesses.

To illustrate additional non-limiting exemplary details of the package substrate 208 in the IC package 200 in FIG. 2A, FIG. 2B is provided. FIG. 2B is a side view of the package substrate 208 as a routing substrate 208 in FIG. 2A. In this regard, as shown in FIG. 2B, the first core layer 110(1) has a first surface 210(1)(1) and a second surface 210(1)(2) opposite the first surface 210(1)(1) in the first, vertical direction (Z-axis direction). The first surface 210(1)(1) is adjacent to the first metallization layer 123(1) of the first, upper metallization structure 122(1) so that the electrical devices 126(1)-126(4) sitting in their respective cavities 114(1)-114(4) can be directly coupled to respective metal interconnects 130(1)(1)-130(1)(4) in the first metallization layer 123(1) of the first, upper metallization structure 122(1) for signal routing. The first core layer 110(1) has the first thickness $H_1$ between the first surface 210(1)(1) and the second surface 210(1)(2). The first cavity 114(1) is disposed in the first core layer 110(1) between the first surface 210(1)(1) and the second surface 210(1)(2) of the first core layer 110(1) such that the first cavity 114(1) has the first thickness $H_1$ of the first core layer 110(1) in the first, vertical direction (Z-axis direction).

Similarly, as also shown in FIG. 2B, the second core layer 110(2) has a third surface 210(2)(1) and a fourth surface 210(2)(2) opposite the third surface 210(2)(1) in the first, vertical direction (Z-axis direction). The second core layer 110(2) has the second thickness $H_2$ between the third surface 210(2)(1) and the fourth surface 210(2)(2). The second cavity 114(2) is disposed in the first and second core layers 110(1), 110(2) between the first surface 210(1)(1) of the first core layer 110(1) and the fourth surface 210(2)(2) of the second core layer 110(2). In this manner, the second cavity 114(2) has the thickness $H_5$ in the first, vertical direction (Z-axis direction) of the combined first thickness $H_1$ of the first core layer 110(1) and the second thickness $H_2$ of the second core layer 110(2) in the first, vertical direction (Z-axis direction). Note that alternatively, the second cavity 114(2) could be formed in just the first core layer 110(1) to be of thickness $H_1$, or extend further in the first, vertical direction (Z-axis direction) into the third or fourth core layers 110(3), 110(4) to be of thickness $H_6$ or $H_7$.

Similarly, as also shown in FIG. 2B, the third core layer 110(3) has a fifth surface 210(3)(1) and a sixth surface 210(3)(2) opposite the fifth surface 210(3)(1) in the first, vertical direction (Z-axis direction). The third core layer 110(3) has the third thickness $H_3$ between the fifth surface 210(3)(1) and the sixth surface 210(3)(2). The third cavity 114(3) is disposed in the first, second, and third core layers 110(1)-110(3) between the first surface 210(1)(1) of the first core layer 110(1) and the sixth surface 210(3)(2) of the third core layer 110(3). In this manner, the third cavity 114(3) has the thickness $H_6$ in the first, vertical direction (Z-axis direction) of the combined first thickness $H_1$ of the first core layer 110(1), the second thickness $H_2$ of the second core layer 110(2), and the third thickness $H_3$ of the third core layer 110(3). Note that alternatively, the second cavity 114(2) could be formed in just the first core layer 110(1) to be of thickness $H_1$, or formed in the first and second core layers 110(1), 110(2) to be of thickness $H_5$, or extend further in the first, vertical direction (Z-axis direction) into the fourth core layer 110(4) to be of thickness $H_7$.

Similarly, as also shown in FIG. 2B, the fourth core layer 110(4) has a seventh surface 210(4)(1) and an eighth surface 210(4)(2) opposite the seventh surface 210(4)(1) in the first, vertical direction (Z-axis direction). The fourth core layer 110(4) has the fourth thickness $H_4$ between the seventh surface 210(4)(1) and the eighth surface 210(4)(2). The metal posts 213(1)-213(3) formed through the core substrate 124 extend between the first surface 210(1)(1) of the first core layer 110(1) and the eighth surface 210(4)(2) of the fourth core layer 110(4) to be coupled to the first, upper and second, lower metallization structures 122(1), 122(2) in this example. The fourth cavity 114(4) is disposed in the first, second, third, and fourth core layers 110(1)-110(4) between the first surface 210(1)(1) of the first core layer 110(1) and the eighth surface 210(4)(2) of the fourth core layer 110(4). In this manner, the fourth cavity 114(4) has the thickness $H_7$ in the first, vertical direction (Z-axis direction) of the combined thickness $H_1$ of the first core layer 110(1), the second thickness $H_2$ of the second core layer 110(2), the third thickness $H_3$ of the third core layer 110(3), and the fourth thickness $H_4$ of the fourth core layer 110(4). Note that alternatively, the fourth cavity 114(4) could be formed in just the first core layer 110(1) to be of thickness $H_1$, or formed in the first and second core layers 110(1), 110(2) to be of thickness $H_5$, or formed in the first, second, and third core layers 110(1)-110(3) to be of thickness $H_6$.

As also shown in FIG. 2B, by the first electrical device 126(1) of first thickness $H_1$ being disposed and embedded either fully or partially in the first cavity 114(1) and the first core layer 110(1) of a compatible thickness $H_1$, a first, front side 212(1)(1) of the first electrical device 126(1) is adjacent to the first metallization layer 123(1). In this manner, the external metal interconnects 202(1) of the first electrical device 126(1) can be exposed at or above the first surface 210(1)(1) of the first core layer 110(1) in the first, vertical direction (Z-axis direction) so that the external metal interconnects 202(1) of the first electrical device 126(1) can be directly coupled to the metal interconnects 130(1)(1) in the first metallization layer 123(1) of the first, upper metallization structure 122(1) for signal routing. A second, back side 212(1)(2) of the first electrical device 126(1) opposite of the first, front side 212(1)(1) in the first, vertical direction (Z-axis direction) is adjacent to the second core layer 110(2).

As also shown in FIG. 2B, by the second electrical device 126(2) of thickness $H_5$ being disposed and embedded either fully or partially in the second cavity 114(2) in the first core layer 110(1) and the second core layer 110(1) of combined compatible first and second thicknesses $H_1$, $H_2$, a third, front side 212(2)(1) of the second electrical device 126(2) is also adjacent to the first metallization layer 123(1). In this manner, the external metal interconnects 202(2) of the second electrical device 126(2) can be exposed at or above the first surface 210(1)(1) of the first core layer 110(1) in the first, vertical direction (Z-axis direction) so that the external metal interconnects 202(2) of the second electrical device 126(2) can be directly coupled to the metal interconnects 130(1)(2) in the first metallization layer 123(1) of the first, upper metallization structure 122(1) for signal routing. A fourth, back side 212(2)(2) of the second electrical device 126(2) opposite the third, front side 212(2)(1) in the first, vertical direction (Z-axis direction) is adjacent to the third core layer 110(3).

As also shown in FIG. 2B, by the third electrical device 126(3) of thickness $H_6$ being disposed and embedded either fully or partially in the third cavity 114(3) in the first, second, and third core layers 110(1)-110(3) of combined compatible first, second, and third thicknesses $H_1$, $H_2$, $H_3$, a fifth, front side 212(3)(1) of the third electrical device 126(3) is also adjacent to the first metallization layer 123(1). In this manner, the external metal interconnects 202(3) of the third electrical device 126(3) can be exposed at or above the first surface 210(1)(1) of the first core layer 110(1) in the first, vertical direction (Z-axis direction) so that the external metal interconnects 202(3) of the third electrical device 126(3) can be directly coupled to the metal interconnects 130(1)(3) in a first metallization layer 123(1) in the first, upper metallization structure 122(1) for signal routing. A sixth, back side 212(3)(2) of the third electrical device 126(3) opposite the fifth, front side 212(3)(1) in the first, vertical direction (Z-axis direction) is adjacent to the fourth core layer 110(4).

As also shown in FIG. 2B, by the fourth electrical device 126(4) of thickness $H_7$ being disposed and embedded either fully or partially in the fourth cavity 114(4) in the first, second, third, and fourth core layers 110(1)-110(4) of combined compatible first, second, third, and fourth thicknesses $H_1$, $H_2$, $H_3$, $H_3$, a seventh, front side 212(4)(1) of the fourth electrical device 126(4) is also adjacent to the first metallization layer 123(1). In this manner, the external metal interconnects 202(4) of the fourth electrical device 126(4) can be exposed at or above the first surface 210(1)(1) of the first core layer 110(1) in the first, vertical direction (Z-axis direction) so that the external metal interconnects 202(4) of the fourth electrical device 126(4) can be directly coupled to the metal interconnects 130(1)(4) in the first metallization layer 123(1) of the first, upper metallization structure 122(1) for signal routing. An eighth, back side 212(4)(2) of the fourth electrical device 126(4) opposite the seventh, front side 212(4)(1) in the first, vertical direction (Z-axis direction) is adjacent to a first metallization layer 125(1) in the second, lower metallization structure 122(2).

In this manner, in the example package substrate 208 in FIGS. 2A and 2B, the electrical devices 126(1)-126(4) are embedded either fully or partially in their respective cavities 114(1)-114(4) such that the electrical devices 126(1)-126(4) are front side routed to the first, upper metallization structure 122(1). In this regard, the electrical devices 126(1)-126(4) are routed from their front sides, namely their first, third, fifth, and seventh front sides 212(1)(1), 212(2)(1), 212(3)(1), 212(4)(1) to the first, upper metallization structure 122(1). As will be discussed in more detail below in other examples, other aspects can include lower side signal routing to the second, lower metallization structure 122(2). This lower side routing can be in addition to or in lieu of front side routing.

FIGS. 3A-3F is a flowchart illustrating an exemplary fabrication process 300 of fabricating a routing substrate that includes multiple core layers with multiple cavities formed at multiple thicknesses to be able to support multiple embedded electrical devices, including, but not limited to, the routing substrates 108(1), 108(2) in FIG. 1 and the package substrate 208 in FIGS. 2A and 2B. The fabrication process 300 in FIGS. 3A-3F is discussed with reference to the package substrate 208 in FIGS. 2A and 2B as a non-limiting example. FIGS. 4A-4I are exemplary fabrication stages 400A-400I during fabrication of the package substrate 208 according to the fabrication process 300 in FIGS. 3A-3F. The fabrication process 300 will be discussed in conjunction with the fabrication stages 400A-400I in FIGS. 4A-4I.

In this regard, as shown in the exemplary fabrication stage 400A in FIG. 4A, a first step in the fabrication process 300 can be to provide the core layers 110(1)-110(4) as separate core layers and form the respective openings in the core layers 110(1)-110(4) of respective thicknesses $H_1$, $H_2$, $H_3$, $H_4$ to eventually form the respective cavities 114(1)-114(4) (block 302 in FIG. 3A). In this regard, the first openings 204(1)(1), 204(1)(2) and 204(1)(3) of the first thickness $H_1$ of the first core layer 110(1) are formed in the first core layer 110(1). In this example, the openings that will form the three cavities 114(1)-114(3) in the package substrate 208 in FIGS. 2A and 2B are shown, but such is not limiting. Second openings 204(2)(1), 204(2)(2) of thickness $H_2$ of the second core layer 110(2) are formed in the second core layer 110(2). A third opening 204(3)(1) of the third thickness $H_3$ of the third core layer 110(3) is formed in the third core layer 110(2). Then, as shown in the exemplary fabrication stage 400B in FIG. 4B, the core layers 110(1)-110(4) are coupled together (e.g., bonded together) to form the single core substrate 124 with the first cavity 114(1) of first thickness $H_1$ and such that the respective first and second openings 204(1)(2) and 204(2)(1) are aligned to form the second cavity 114(2) of thickness $H_5$, and the respective first, second, and third openings 204(1)(3), 204(2)(2), and 204(3)(1) are aligned to form the third cavity 114(3) of thickness $H_6$ (block 304 in FIG. 3A). As previously discussed, the coupling of the core layers 110(1), 110(2) together forms the second cavity 114(2) of thickness $H_5$ which is the first thickness $H_1$ of the first core layer 110(1) combined with the second thickness $H_2$ of the second core layer 110(2). Also, as previously discussed, the coupling of the core layers 110(1), 110(2), and 110(3) together forms the third cavity 114(3) of thickness $H_6$ which is the first thickness $H_1$ of the first core layer 110(1) combined with the second thickness $H_2$ of the second core layer 110(2), and the third thickness $H_3$ of the third core layer 110(3).

Then, as shown in the exemplary fabrication stage 400C in FIG. 4C, openings 401(1)-401(3) are drilled in the core substrate 124 to provide for the metal posts 213(1)-213(3) to be formed in the core substrate 124 (block 306 in FIG. 3B). As also shown in the fabrication stage 400C in FIG. 4C, metal interconnects 402(1), 402(2) are formed for the metal posts 213(1)-213(3), and other metal interconnects 404(1), 404(2) are formed adjacent to the respective first and fourth core layers 110(1), 110(4) in what will become the first metallization layer 123(1) of the first, upper metallization structure 122(1) and the first metallization layer 125(1) of the second, lower metallization structure 122(2) (block 306 in FIG. 3B). The fabrication stage 400C in FIG. 4C also shows the fourth cavity 114(4) of thickness $H_7$ formed in the core layers 110(1)-110(4) by respective first, second, third, and fourth openings 204(1)(4), 204(2)(3), 204(3)(2), 204(4)(1) formed in the respective core layers 110(1)-110(4) aligned when the core layers 110(1)-110(4) are coupled to each other. Then, as shown in the exemplary fabrication stage 400D in FIG. 4D, the electrical devices 126(1)-126(4), which may be suspended by a lamination tape 406 coupled to their respective external metal interconnects 202(1)-202(4), are disposed in their respective cavities 114(1)-114(4) to be embedded either fully or partially therein (block 308 in FIG. 3B). Each of the electrical devices 126(1)-126(4) can be either fully or partially embedded in their respective cavities 114(1)-114(4). The electrical devices 126(1)-126(4) can be placed in their respective cavities 114(1)-114(4) by lowering the suspended electrical devices 126(1)-126(4) attached to the lamination tape 406 into their respective cavities 114(1)-114(4).

Then, as shown in the exemplary fabrication stage 400E in FIG. 4E, a second insulating layer 408(2) is disposed on the metal interconnects 402(2), 404(2) to insulate them, and a second pre-impregnated (PPG) lamination layer 410(2) is then disposed on the second insulating layer 408(2) (block 310 in FIG. 3C). Then, as shown in the exemplary fabrication stage 400F in FIG. 4F, the lamination tape 406 that assists in embedding the electrical devices 126(1)-126(4) either fully or partially in the respective cavities 114(1)-114(4) is removed, and a first insulating layer 408(1) is disposed on the external metal interconnects 202(1)-202(4), 402(1), 404(1) to insulate them, and a first PPG lamination layer 410(1) is then disposed on the first insulating layer 408(1) (block 312 in FIG. 3C).

Then, as shown in the exemplary fabrication stage 400G in FIG. 4G, the first, upper and second, lower metallization structures 122(1), 122(2) are formed adjacent to the respective first and fourth core layers 110(1), 110(4) of the core substrate 124 (block 314 in FIG. 3D). First, second, and third metallization layers 123(1)-123(3) are built upon each other for the first, upper metallization structure 122(1). Metal interconnects 130(1) are patterned in the first, second, and third metallization layers 123(1)-123(3), with certain metal interconnects 130(1) in the first metallization layer 123(1) being coupled to the external metal interconnects 202(1)-202(4) of the embedded electrical devices 126(1)-126(4). Other metal interconnects 130(1) are coupled to the metal interconnects 402(1) of the metal posts 213(1)-213(3) to provide signal routing paths between the first, upper and second, lower metallization structures 122(1), 122(2). First, second, and third metallization layers 125(1)-125(3) are built upon each other for the second, lower metallization structure 122(2). Metal interconnects 130(2) are patterned in the first, second, and third metallization layers 125(1)-125(3) to provide signal routing paths. Certain metal interconnects 130(2) are coupled to the metal interconnects 402(2) of the metal posts 213(1)-213(3) to provide signal routing paths between the first, upper and second, lower metallization structures 122(1), 122(2).

Figure 4H:
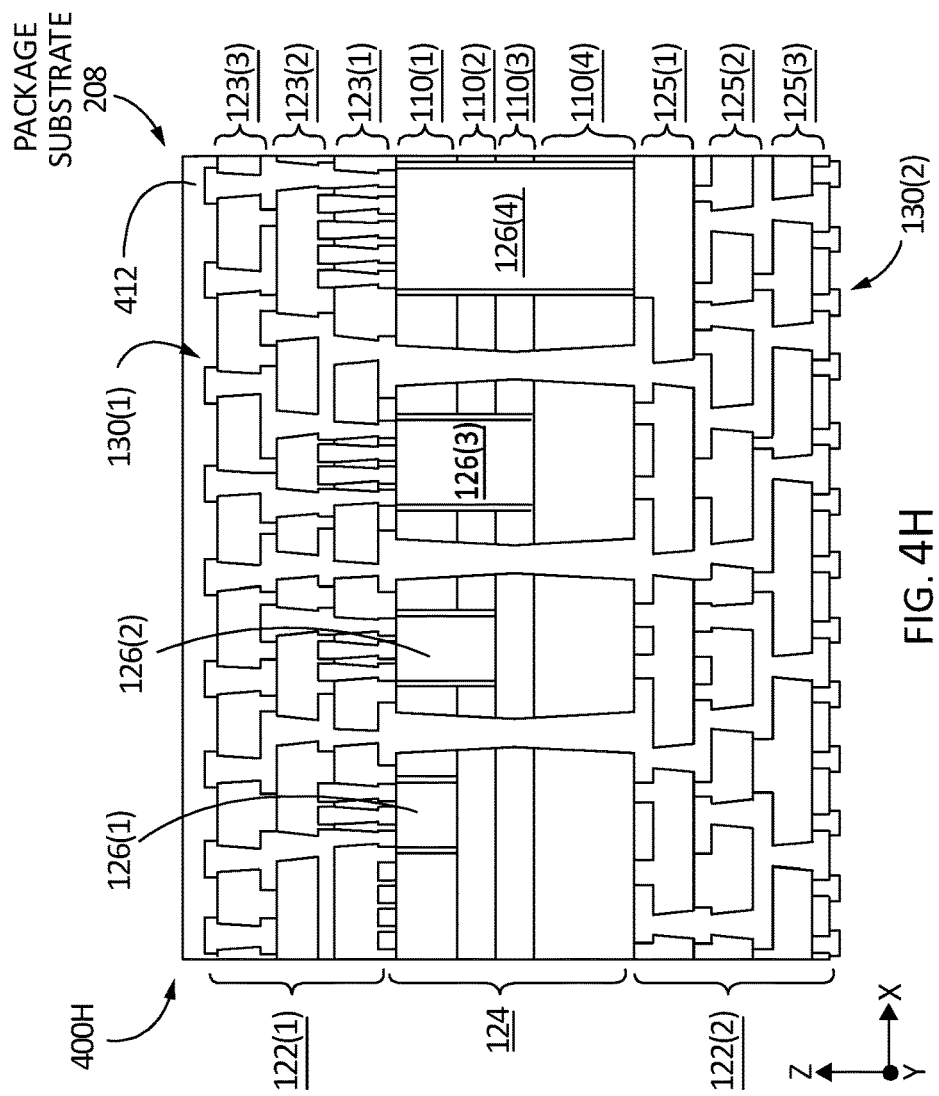
Figure 3E:
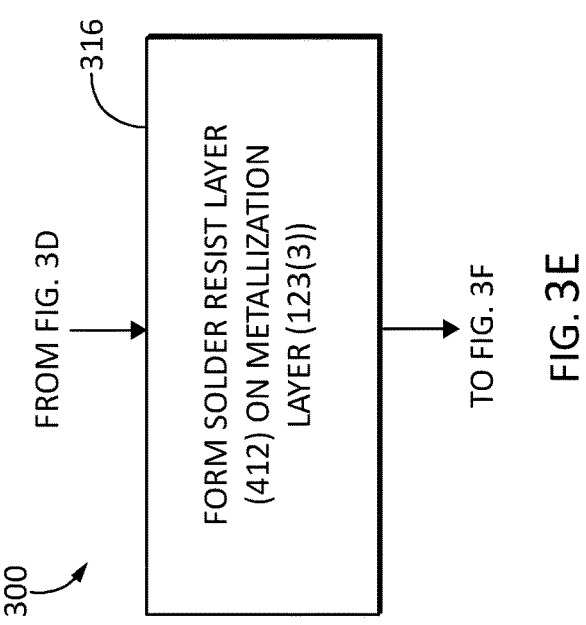

Then, as shown in the exemplary fabrication stage 400H in FIG. 4H, a solder resist layer 412 is formed on the third metallization layer 123(3) to insulate the third metallization layer 123(3) and to prepare for openings 414 to be patterned in the solder resist layer 412 to expose the metal interconnects 130(1) therein to form external metal interconnects 146 as shown in FIGS. 2A and 2B (block 316 in FIG. 3E). Then, as shown in the exemplary fabrication stage 400I in FIG. 4I, the external metal interconnects 146 are formed in the openings 414 formed in the solder resist layer 412 to be coupled to the third metallization layer 123(3) for signal routing through the package substrate 208 (block 318 in FIG. 3F).

FIG. 5 is a flowchart illustrating alternative process steps for a fabrication process 500 that replaces the process steps 302-306 in the fabrication process 300 in FIGS. 3A and 3B, wherein the metal posts 213(1)-213(3) are formed prior to the core layers 110(1)-110(4) being coupled together. FIGS. 6A and 6B are exemplary fabrication stages 600A-600B for the alternative process steps in the fabrication process 500 in FIG. 5 that replace the process steps 302-306 in the fabrication process 300 in FIGS. 3A-3F. Note that process steps 308-318 in FIGS. 3C-3F can be included as subsequent process steps for the fabrication process 500 in FIG. 5.

In this regard, as shown in the exemplary fabrication stage 600A in FIG. 6A, a first step in the fabrication process 500 can be to provide the core layers 110(1)-110(4) as separate core layers and forming the respective openings in the core layers 110(1)-110(4) of respective thicknesses $H_1$, $H_2$, $H_3$, $H_4$ to eventually form the respective cavities 114(1)-114(4) like shown in block 302 in FIG. 3A (block 502 in FIG. 5). The previous discussion of the process step in block 302 in FIG. 3A is also applicable for the process step in block 502 in FIG. 5A. However, as shown in fabrication stage 600A in FIG. 6A, the process step in block 502 in FIG. 5A also involves forming metal posts that will form the full metal posts 213(1)-213(3) in the core layers 110(1)-110(4) when separated from each other and before being coupled together. In this regard, as shown in FIG. 6A, first metal posts 602(1)(1), 602(1)(2), 602(1)(3) are formed in the first core layer 110(1). Second metal posts 602(2)(1), 602(2)(2), 602(2)(3) are formed in the second core layer 110(1). Third metal posts 602(3)(1), 602(3)(2), 602(3)(3) are formed in the third core layer 110(3). Fourth metal posts 602(4)(1), 602(4)(2), 602(4)(3) are formed in the fourth core layer 110(3).

Then, as shown in exemplary fabrication stage 600B in FIG. 6B, when the core layers 110(1)-110(4) are coupled to each other, the first metal post 602(1)(1), second metal post 602(2)(1), third metal post 602(3)(1), and fourth metal post 602(4)(1) align with each other to form a continuous metal post 213(1) (block 604 in FIG. 6A). Also, when the core layers 110(1)-110(4) are coupled to each other, the first metal post 602(1)(2), second metal post 602(2)(2), third metal post 602(3)(2), and fourth metal post 602(4)(2) align with each other to form a continuous metal post 213(2) (block 504 in FIG. 5). Also, when the core layers 110(1)-110(4) are coupled to each other, the first metal post 602(1)(3), second metal post 602(2)(3), third metal post 602(3)(3), and fourth metal post 602(4)(3) align with each other to form a continuous metal post 213(3) (block 604 in FIG. 6A). The process step in block 504 in FIG. 5 in essence is a combination of process steps in block 304 and 306 in FIGS. 3B and 3C. The process steps in blocks 308-318 in FIG. 3B-3F previously described above can be performed after the process step in block 504 in FIG. 5 to continue with fabrication of the package substrate 208.

Then, as shown in the exemplary fabrication stage 400B in FIG. 4B, the core layers 110(1)-110(4) are coupled together (e.g., bonded together) to form the single core substrate 124 with the first cavity 114(1) of first thickness $H_1$ and such that the respective first and second openings 204(1)(2) and 204(2)(1) are aligned to form the second cavity 114(2) of thickness $H_5$ and the respective first, second, and third openings 204(1)(3), 204(2)(2), and 204(3)(1) are aligned to form the third cavity 114(3) of thickness $H_6$ (block 304 in FIG. 3A). As previously discussed, the coupling of the core layers 110(1), 110(2) together forms the second cavity 114(2) of thickness $H_5$ which is the first thickness $H_1$ of the first core layer 110(1) combined with the second thickness $H_2$ of the second core layer 110(2). Also, as previously discussed, the coupling of the core layers 110(1), 110(2), and 110(3) together forms the third cavity 114(3) of thickness $H_6$ which is the first thickness $H_1$ of the first core layer 110(1) combined with the second thickness $H_2$ of the second core layer 110(2), and the third thickness $H_3$ of the third core layer 110(3).

Figure 7:
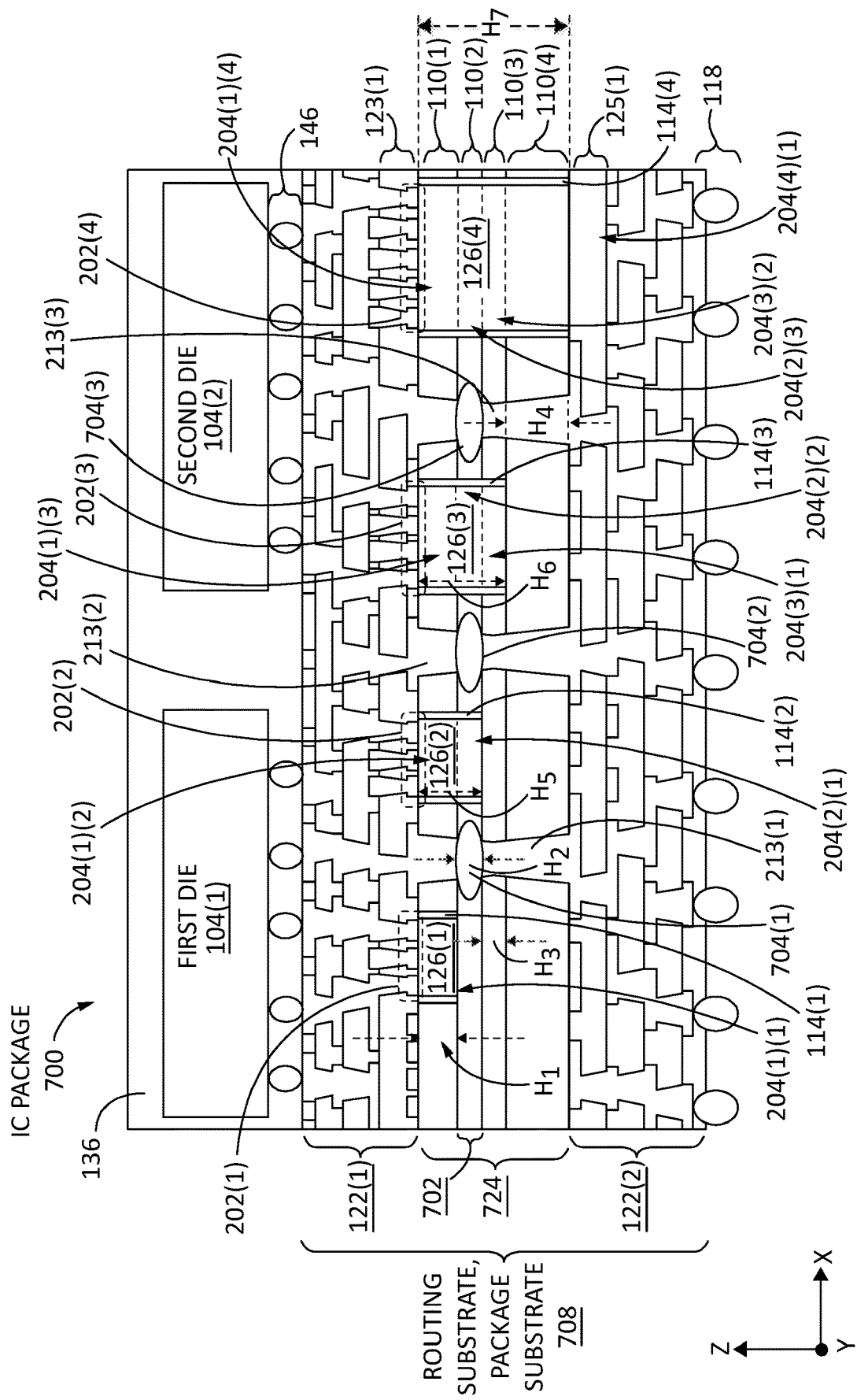
FIG. 7 is a side view of another exemplary IC package like the IC package in FIGS. 2A and 2B that includes multiple core layers coupled together through conductive bumps.

FIG. 7 is a side view of another exemplary IC package 700 that includes a package substrate 708 that is similar to the package substrate 208 in FIGS. 2A and 2B. Common elements between the IC package 700 in FIG. 7 and the IC package 200 in FIGS. 2A and 2B are shown with common element numbers. However, in the package substrate 708 in FIG. 7, a core substrate 724 is provided that not only includes the multiple core layers 110(1)-110(4), but includes an interconnect layer 702 that includes conductive interconnects 704(1)-704(3) (e.g., solder bumps, BGA interconnects, micro metal bumps, etc.) that mechanically and electrically couple the first and second core layers 110(1), 110(2) together. This may be desired for example, if it is not possible to form the metal posts 213(1)-213(3) as continuous metal structures between the first core layer 110(1) and the fourth core layer 110(4). In this regard, as shown in FIG. 7, the metal posts 213(1)-213(3) are formed from the metal posts 602(1)(1)-602(1)(3) formed in the first core layer 110(1), and the metal posts 602(2)(1)-602(4)(3) formed in the respective second, third, and fourth core layers 110(2)-110(4).

Figure 8:
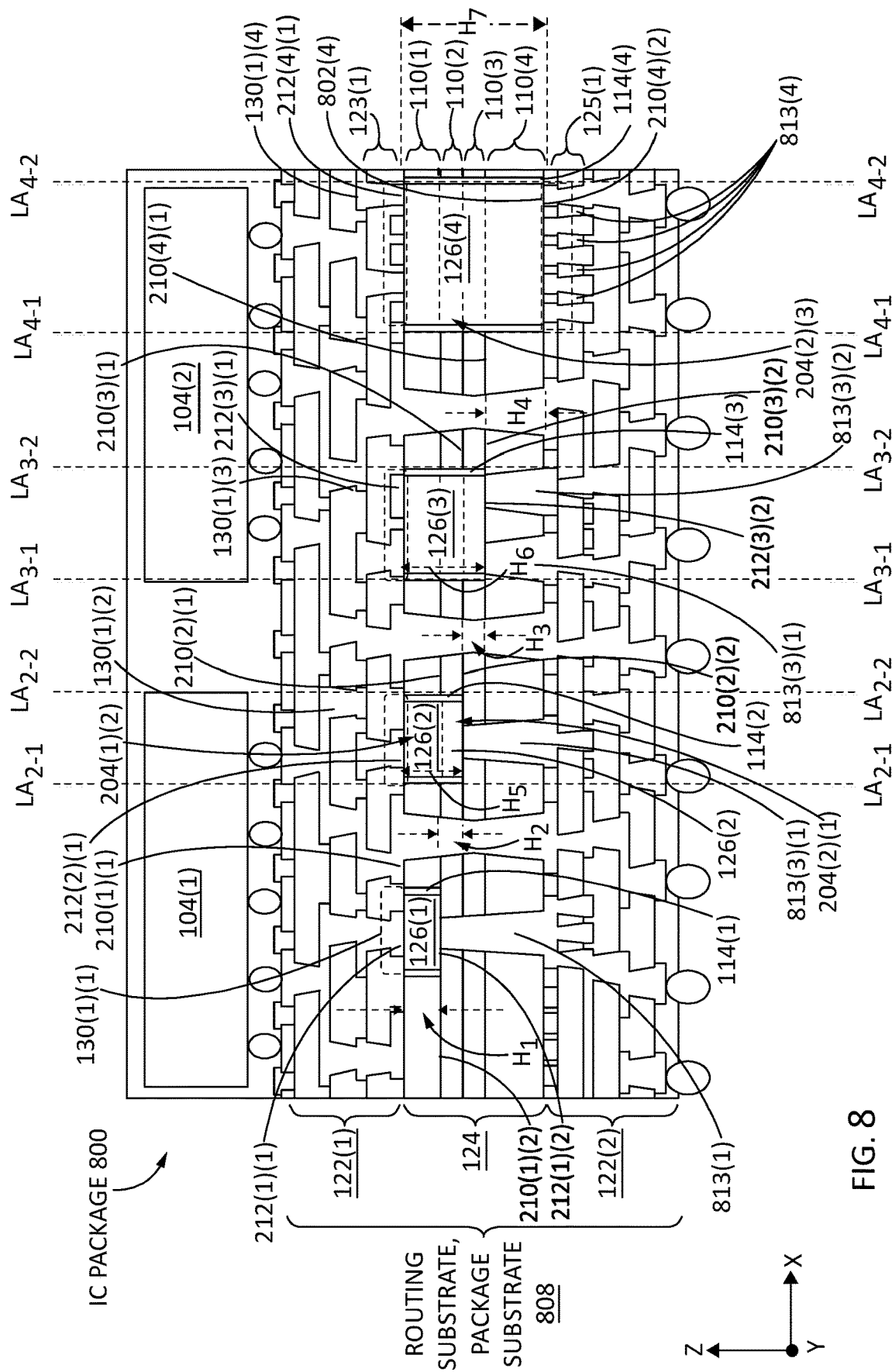
FIG. 8 is a side view of another exemplary IC package that includes a first die package coupled to a first substrate as a package substrate, wherein the substrate(s) includes multiple core layers with multiple cavities formed at multiple depths and supporting multiple embedded electrical devices having back side signal routing to the substrate.

The package substrates 208, 708 in FIGS. 2A-2B and 7 show front side routing of the electrical devices 126(1)-126(4) embedded either fully or partially in the respective cavities 114(1)-114(4) in the core substrate 124, 724 to the first, upper metallization structure 122(1). However, it may be desired to also provide back side routing between the electrical devices 126(1)-126(4) embedded either fully or partially in the respective cavities 114(1)-114(4) to the second, lower metallization structure 122(2). In this regard, FIG. 8 is a side view of another exemplary IC package 800 that includes another routing substrate 808 as a substrate in the form of a package substrate 808 that is similar to the IC package 200 and its package substrate 208 in FIGS. 2A and 2B. Common elements between the IC package 200 and its package substrate 208 in FIGS. 2A and 2B, and the IC package 800 and its package substrate 808 in FIG. 8 are shown with common elements numbers. However, as shown in FIG. 8, the second, fourth, sixth, and eighth back sides 212(2)(1), 212(2)(2), 212(3)(2), 212(4)(2) of the respective electrical devices 126(1)-126(4) are exposed from their respective cavities 114(1)-114(4) to allow the electrical devices 126(1)-126(4) to be back side electrically coupled to the second, lower metallization structure 122(2). In this example, this back side signal routing of the electrical devices 126(1)-126(4) to the second, lower metallization structure 122(2) is in addition to the first, third, fifth, and seventh front sides 212(1)(1), 212(2)(1), 212(3)(1), 212(4)(1) of the respective electrical devices 126(1)-126(4) being exposed from their respective cavities 114(1)-114(4) to allow front side routing to the first, upper metallization structure 122(1).

In this regard, as shown in FIG. 8, the second back side 212(2)(1) of the first electrical device 126(1) is exposed from the first cavity 114(1). A first metal interconnect 813(1) (e.g., a metal post(s)) extending through the second, third, and fourth core layers 110(2)-110(4) is electrically coupled to the first electrical device 126(1) and the second, lower metallization structure 122(2). This provides back side signal routing between the first electrical device 126(1) and the second, lower metallization structure 122(2) without such signal routing having to be routed necessarily through the first, upper metallization structure 122(1). Also, the fourth back side 212(2)(2) of the second electrical device 126(2) is exposed from the second cavity 114(2). A second metal interconnect 813(2) (e.g., a metal post(s)) extending through the third and fourth core layers 110(3), 110(4) is electrically coupled to the second electrical device 126(2) and the second, lower metallization structure 122(2). This provides back side signal routing between the second electrical device 126(2) and the second, lower metallization structure 122(2) without such signal routing having to be routed necessarily through the first, upper metallization structure 122(1).

With continued reference to FIG. 8, the sixth back side 212(3)(2) of the third electrical device 126(2) is exposed from the third cavity 114(3). Third metal interconnects 813(3)(1), 813(3)(2) (e.g., a metal post(s)) extending through the fourth core layer 110(4) are electrically coupled to the third electrical device 126(3) and the second, lower metallization structure 122(2). This provides back side signal routing between the third electrical device 126(3) and the second, lower metallization structure 122(2) without such signal routing having to be routed necessarily through the first, upper metallization structure 122(1). Also in this example, the eighth back side 212(4)(2) of the fourth electrical device 126(4) adjacent to the second, lower metallization structure 122(2) is exposed from the fourth cavity 114(4). External metal interconnects 802(4) of the fourth electrical device 126(4) are coupled to fourth metal interconnects 813(4) (e.g., vias, metal traces, metal lines) to electrically couple the fourth electrical device 126(4) and the second, lower metallization structure 122(2). This provides back side signal routing between the fourth electrical device 126(4) and the second, lower metallization structure 122(2) without such signal routing having to be routed necessarily through the first, upper metallization structure 122(1).

It may also be desired to only provide back side routing of the embedded electrical devices 126(1)-126(4) in a substrate like the package substrates 208, 708, 808 in FIGS. 2A-2B, 7, and 8. In this regard, the signal routing paths between the embedded electrical devices 126(1)-126(4) and a metallization structure adjacent to a back side of the electrical devices 126(1)-126(4) in their orientation embedded either fully or partially in a core substrate can be minimized. For example, in the package substrate 208 in FIGS. 2A and 2B, back side routing to the electrical devices 126(1)-126(2) would be through the second, lower metallization structure 122(2).

Figure 9:
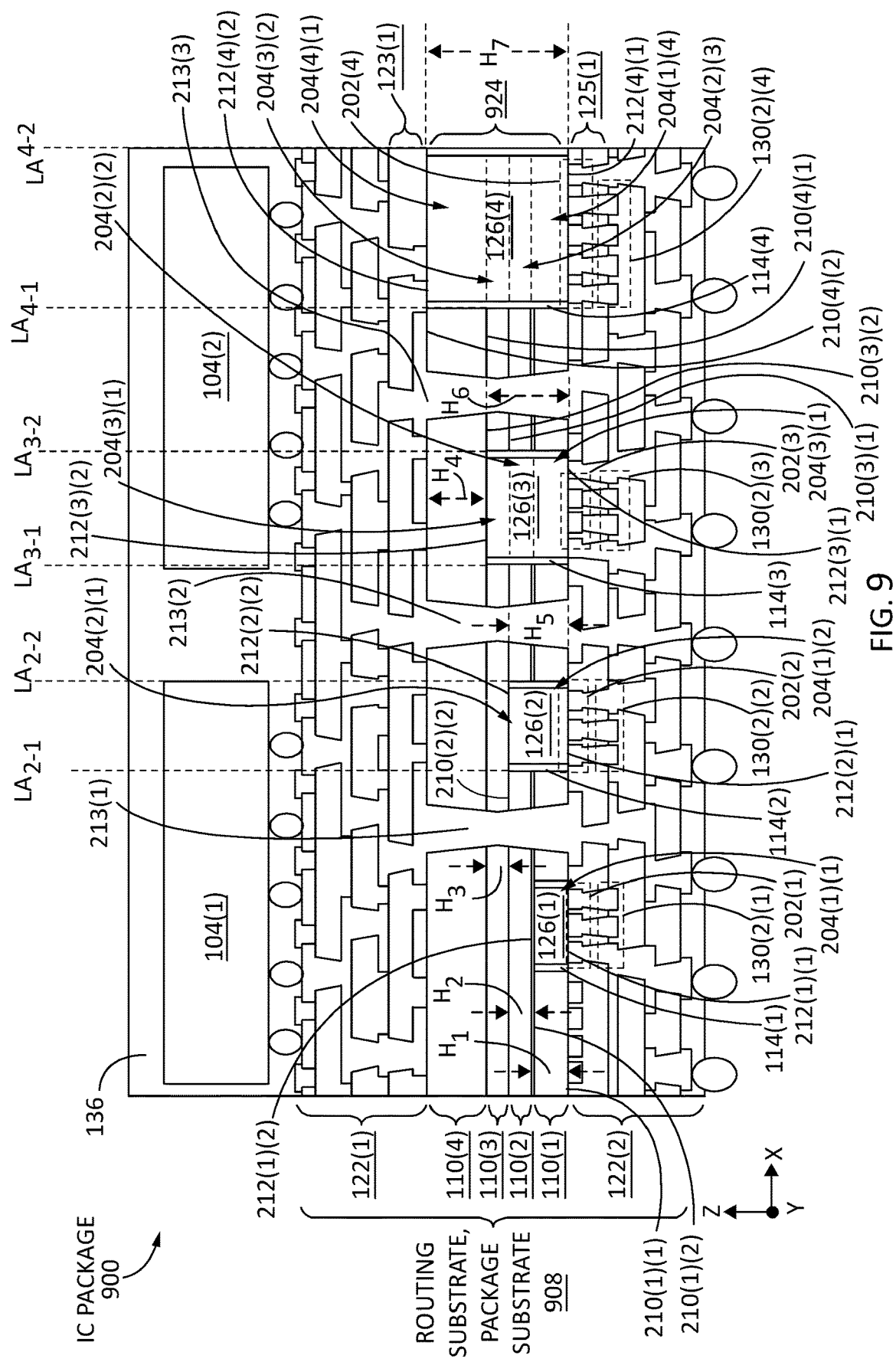
FIG. 9 is a side view of another exemplary IC package that includes a first die package coupled to a first substrate as a package substrate, wherein the substrate(s) includes multiple core layers with multiple cavities formed at multiple depths and supporting multiple embedded electrical devices having lower side signal routing to the substrate.

In this regard, FIG. 9 is a side view of another exemplary IC package 900 that includes a routing substrate 908 as a substrate in the form of a package substrate 908 that is similar to the IC package 200 and its package substrate 208 in FIGS. 2A and 2B, for example. As discussed below, the core substrate 924 in the package substrate 908 in FIG. 9 is rotated upside down, one-hundred and eighty degrees in the vertical direction (Z-axis direction) from the core substrate 124 in the package substrate 208 in FIGS. 2A and 2B to provide for lower routing of the electrical devices 126(1)-126(4) embedded either fully or partially in the respective cavities 114(1)-114(4) to the second, lower metallization structure 122(2). The first, third, fifth, and seventh front sides 212(1)(1), 212(2)(1), 212(3)(1), 212(4)(1) of the electrical devices 126(1)-126(4) are still routed like in the package substrate 208 in FIGS. 2A and 2B, however, the first, third, fifth, and seventh front sides 212(1)(1), 212(2)(1), 212(3)(1), 212(4)(1) of the electrical devices 126(1)-126(4) are signal routed to the second, lower metallization structure 122(2) in FIG. 9, as opposed to the first, upper metallization structure 122(1) as shown in FIGS. 2A and 2B. Common elements between the IC package 900 and its package substrate 908 in FIG. 9, and the IC package 200 and its package substrate 208 in FIGS. 2A and 2B are shown with common element numbers.

As shown in FIG. 9, the core substrate 924 includes the multiple separate core layers 110(1)-110(4) that are coupled together in the first, vertical direction (Z-axis direction) to form the core substrate 924 as part of the package substrate 908. Metal posts 213(1)-213(3) (i.e., vertical interconnects) are formed through the core substrate 924 through the combined, coupled core layers 110(1)-114(4) to provide pass through signal routing paths between the first, upper and second, lower metallization structures 122(1), 122(2). The thicknesses $H_1$, $H_2$, $H_3$, $H_4$ of the respective cavities 114(1)-114(4) in the core layers 110(1)-110(4) are designed to be compatible with the thicknesses $H_1$, $H_5$, $H_6$, $H_7$ of the respective electrical devices 126(1)-126(4) in the first, vertical direction (Z-axis direction) just as provided in the core substrate 124 in FIGS. 2A and 2B. This allows the external metal interconnects 202(1)-202(4) of the respective electrical devices 126(1)-126(4) to be adjacent to the first metallization layer 125(1) of the second, lower metallization structure 122(2) when the electrical devices 126(1)-126(4) are disposed in and resting in their respective cavities 114(1)-114(4) for lower side routing to the second, lower metallization structure 122(2).

With continued reference to FIG. 9, the first surface 210(1)(1) of the first core layer 110(1) is adjacent to the first metallization layer 125(1) of the second, lower metallization structure 122(2) so that the electrical devices 126(1)-126(4) sitting in their respective cavities 114(1)-114(4) can be directly coupled to the respective metal interconnects 130(2)(1)-130(2)(4) in the first metallization layer 125(1) for signal routing. The second cavity 114(2) is disposed in the first and second core layers 110(1), 110(2) between the first surface 210(1)(1) of the first core layer 110(1) and the fourth surface 210(2)(2) of the second core layer 110(2). The third cavity 114(3) is disposed in the first, second, and third core layers 110(1)-110(3) between the first surface 210(1)(1) of the first core layer 110(1) and the sixth surface 210(3)(2) of the third core layer 110(3). The fourth cavity 114(4) is disposed in the first, second, third, and fourth core layers 110(1)-110(4) between the first surface 210(1)(1) of the first core layer 110(1) and the eighth surface 210(4)(2) of the fourth core layer 110(4). The metal posts 213(1)-213(3) formed through the core substrate 924 extend between the first surface 210(1)(1) of the first core layer 110(1) and the eighth surface 210(4)(2) of the fourth core layer 110(4) to be coupled to the first, upper and second, lower metallization structures 122(1), 122(2) in this example.

As also shown in FIG. 9, by the first electrical device 126(1) of the first thickness $H_1$ being disposed and embedded either fully or partially in the first cavity 114(1) and the first core layer 110(1), the first front side 212(1)(1) of the first electrical device 126(1) is adjacent to the first metallization layer 125(1). In this manner, the external metal interconnects 202(1) of the first electrical device 126(1) can be exposed at or above the first surface 210(1)(1) of the first core layer 110(1) in the first, vertical direction (Z-axis direction) so that the external metal interconnects 202(1) of the first electrical device 126(1) can be directly coupled to the metal interconnects 130(2)(1) in the first metallization layer 125(1) in the second, lower metallization structure 122(2) for signal routing. By the second electrical device 126(2) of thickness $H_5$ being disposed and embedded either fully or partially in the second cavity 114(2) in the first core layer 110(1) and the second core layer 110(1) of combined compatible first and second thicknesses $H_1$, $H_2$, the third front side 212(2)(1) of the second electrical device 126(2) is also adjacent to the first metallization layer 125(1). In this manner, the external metal interconnects 202(2) of the second electrical device 126(2) can be exposed at or above the first surface 210(1)(1) of the first core layer 110(1) in the first, vertical direction (Z-axis direction) so that the external metal interconnects 202(2) of the second electrical device 126(2) can be directly coupled to the metal interconnects 130(2)(2) in the first metallization layer 125(1) in the second, lower metallization structure 122(2) for signal routing.

As also shown in FIG. 9, by the third electrical device 126(3) of thickness $H_6$ being disposed and embedded either fully or partially in the third cavity 114(3) in the first, second, and third core layers 110(1)-110(3) of combined compatible first, second, and third thicknesses $H_1$, $H_2$, $H_3$, the fifth front side 212(3)(1) of the third electrical device 126(3) is also adjacent to the first metallization layer 125(1). In this manner, the external metal interconnects 202(3) of the third electrical device 126(3) can be exposed at or above the first surface 210(1)(1) of the first core layer 110(1) in the first, vertical direction (Z-axis direction) so that the external metal interconnects 202(3) of the third electrical device 126(3) can be directly coupled to the metal interconnects 130(2)(3) in the first metallization layer 125(1) in the second, lower metallization structure 122(2) for signal routing. Also, by the fourth electrical device 126(4) of thickness $H_7$ being disposed and embedded either fully or partially in the fourth cavity 114(4) in the first, second, third, and fourth core layers 110(1)-110(4) of combined compatible first, second, third, and fourth thicknesses $H_1$, $H_2$, $H_3$, $H_3$, the seventh front side 212(4)(1) of the fourth electrical device 126(4) is also adjacent to the first metallization layer 125(1) of the second, lower metallization structure 122(2). In this manner, the external metal interconnects 202(4) of the fourth electrical device 126(4) can be exposed at or above the first surface 210(1)(1) of the first core layer 110(1) in the first, vertical direction (Z-axis direction) so that the external metal interconnects 202(4) of the fourth electrical device 126(4) can be directly coupled to the metal interconnects 130(2)(4) in the first metallization layer 125(1) of the second, lower metallization structure 122(2) for signal routing.

In this manner, in the example package substrate 908 in FIG. 9, the electrical devices 126(1)-126(4) are embedded either fully or partially in their respective cavities 114(1)-114(4) such that the electrical devices 126(1)-126(4) are lower side routed to the second, lower metallization structure 122(2). In this regard, the electrical devices 126(1)-126(4) are routed from their lower sides, namely their first, third, fifth, and seventh front sides 212(1)(1), 212(2)(1), 212(3)(1), 212(4)(1) to the second, lower metallization structure 122(2).

Figure 10:
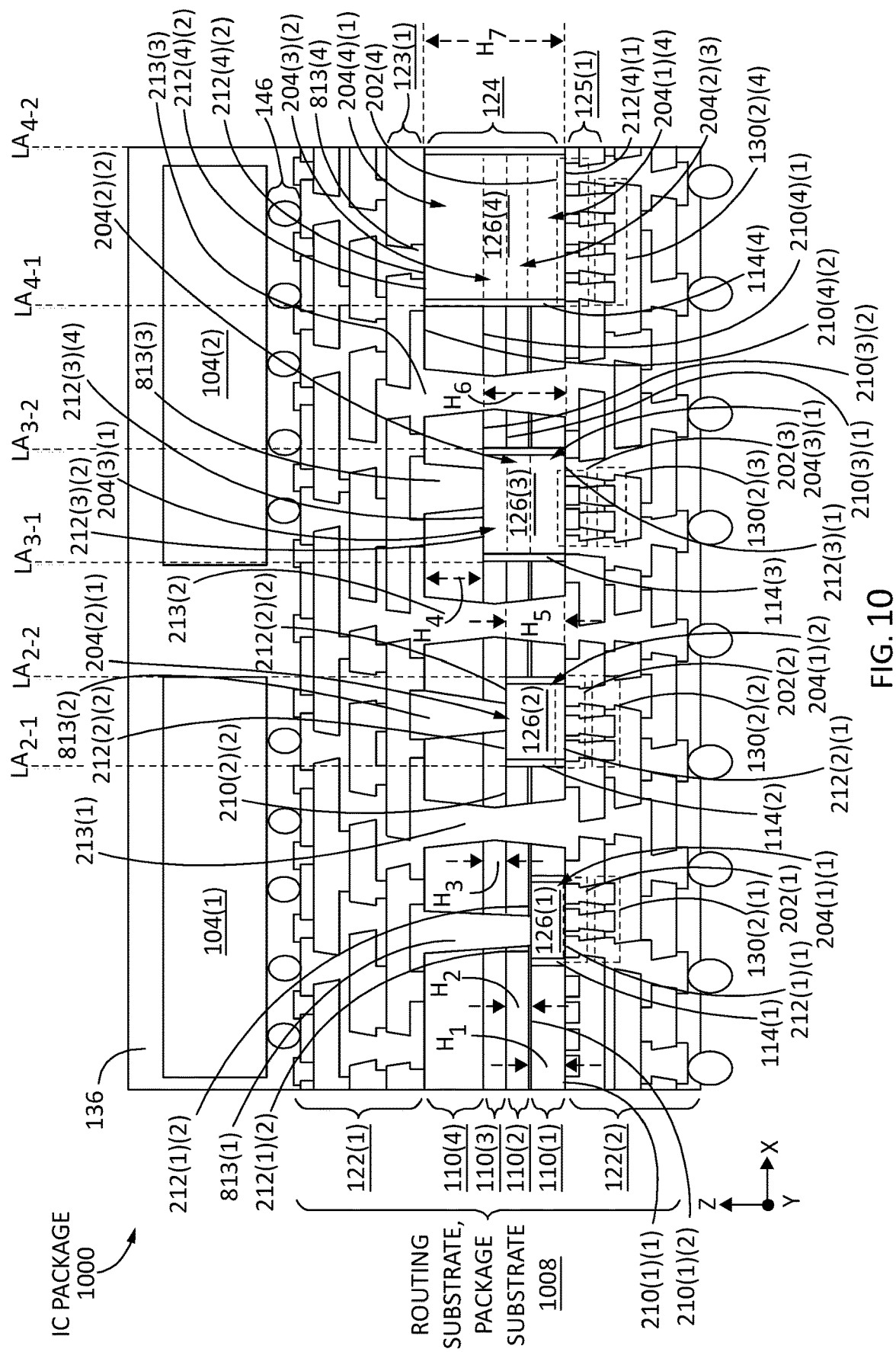
FIG. 10 is a side view of another exemplary IC package that includes a first die package coupled to a first substrate as a package substrate, wherein the substrate(s) includes multiple core layers with multiple cavities formed at multiple depths and supporting multiple embedded electrical devices having front side signal routing to the substrate.

FIG. 10 is a side view of another exemplary IC package 1000 that includes another routing substrate 1008 as a substrate in the form of a package substrate 1008 that is similar to the IC package 900 and its package substrate 908 in FIG. 9. Common elements between the IC package 900 and its package substrate 908 in FIG. 9, and the IC package 1000 and its package substrate 1008 in FIG. 10 are shown with common element numbers. However, as shown in FIG. 10, the second, fourth, sixth, and eighth back sides 212(1)(2), 212(2)(2), 212(3)(2), 212(4)(2) of the respective electrical devices 126(1)-126(4) are also exposed from their respective cavities 114(1)-114(4) in the core substrate 124 to allow the electrical devices 126(1)-126(4) to be back side electrically coupled to the first, upper metallization structure 122(1). In this example, this back side signal routing of the electrical devices 126(1)-126(4) to the first, upper metallization structure 122(1) is in addition to the first, third, fifth, and seventh front sides 212(1)(1), 212(2)(1), 212(3)(1), 212(4)(1) of the respective electrical devices 126(1)-126(4) being exposed from their respective cavities 114(1)-114(4) to allow front side routing to the second, lower metallization structure 122(2).

FIGS. 11A-11C is a flowchart illustrating a fabrication process 1100 that includes alternative process steps for the process steps 314-318 in the fabrication process 300 in FIGS. 3G-3I, to form the package substrate 1008 in FIG. 10. The process steps 302-316 in the fabrication process 300 in FIGS. 3A-3F can be included as prior process steps for the fabrication process 1100 in FIG. 11 to fabricate the package substrate 1008 in FIG. 10. FIGS. 12A-12C are exemplary fabrication stages 1200A-1200C for the alternative process steps in FIGS. 11A-11C for the process steps 314-318 in the fabrication process 300 in FIGS. 3G-3I. As discussed below, in the fabrication process 1100, the core substrate 124 in FIG. 10 is flipped upside down and back side routing provided as discussed in the IC package 1000 in FIG. 10 above.

In this regard, as shown in the exemplary fabrication stage 1200A in FIG. 12A, a next step in the fabrication process 1100 after process step 312 in FIG. 3F can be to flip the core substrate 124 upside down and then form the first, upper metallization structure 122(1) adjacent to the eighth surface 210(4)(2) of the fourth core layer 110(4) and the second, lower metallization structure 122(2) adjacent to the first surface 210(1)(1) of the first core layer 110(1) (block 1102 in FIG. 11A). As discussed in FIG. 10 above, this provides for the front side routing to be provided as lower side routing between the electrical devices 126(1)-126(4) and the second, lower metallization structure 122(2), and back side routing between the electrical devices 126(1)-126(4) and the first, upper metallization structure 122(1). Then, as shown in the exemplary fabrication stage 1200B in FIG. 12B, and as also provided in the process step block 316 in FIG. 3E, the solder resist layer 412 is formed on the third metallization layer 123(3) to insulate the third metallization layer 123(3) and to prepare for openings to be patterned in the solder resist layer 412 to expose the metal interconnects 130(1) therein to form external metal interconnects 146 as shown in FIG. 10 (block 1104 in FIG. 11B). Then, as shown in the exemplary fabrication stage 1200C in FIG. 12C, the external metal interconnects 146 are formed in openings 414 formed in the solder resist layer 412 to be coupled to the third metallization layer 123(3) for signal routing through the package substrate 1008 (block 1106 in FIG. 11C).

In yet another alternative fabrication process, the metal posts 213(1)-213(3) in the package substrate 1008 in FIG. 10 are formed prior to the core layers 110(1)-110(4) being coupled together. This is shown by a combination of previous process steps described above. For example, this alternative fabrication process can involve the same process as in the fabrication process 500 in FIG. 5, but with the package substrate flipped upside down. That is, this alternative process can include process steps 502 and 504 in FIG. 5 and shown in fabrication stages 600A and 600B in FIGS. 6A and 6B, followed by process steps 308-318 in the fabrication process 300 in FIGS. 3C-3F and shown in fabrication stages 400C-400I in FIGS. 4C-4I, but with the package substrate flipped upside down in reverse from how it is shown in those process steps.

Figure 13:
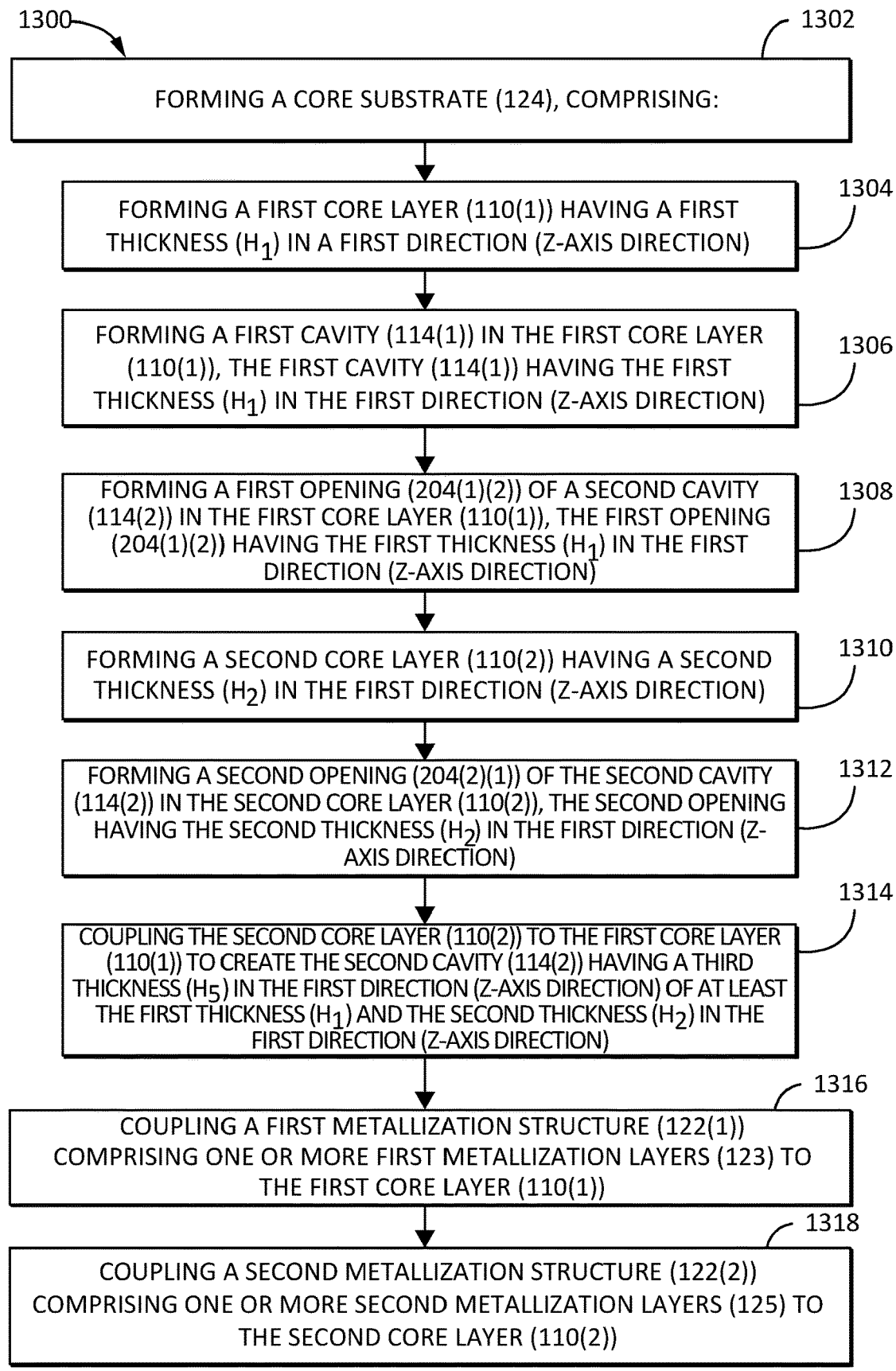
FIG. 13 is a flowchart illustrating an exemplary fabrication process of fabricating a substrate that includes multiple core layers with multiple cavities formed at multiple depths and supporting multiple embedded electrical devices signal routed to the substrate, including, but not limited to, the substrates in FIGS. 1-2B, 4A-4I, 6A-6B, 7-10, and 12A-12C.

Other fabrication processes can be employed to fabricate a substrate that includes multiple core layers with multiple cavities formed at multiple depths and supporting multiple embedded electrical devices signal routed to the substrate, including, but not limited to, the routing substrates 108(1), 108(2), 208, 708, 808, 908, 1008 in FIGS. 1-2B, 4A-4I, 6A-6B, 7-10, and 12A-12C. In this regard, FIG. 13 is a flowchart illustrating an exemplary fabrication process 1300 of fabricating a substrate that includes multiple core layers with multiple cavities formed at multiple depths and supporting multiple embedded electrical devices signal routed to the substrate, including, but not limited to, the routing substrates 108(1), 108(2), 208, 708, 808, 908, 1008 in FIGS. 1-2B, 4A-4I, 6A-6B, 7-10, and 12A-12C. The fabrication process 1300 in FIG. 13 is discussed with regard to the routing substrate 208 in FIGS. 2A and 2B, but note that the fabrication process 1300 in FIG. 13 is not limited to fabricating the routing substrate 208 in FIGS. 2A and 2B. The fabrication process 1300 in FIG. 13 could be used to fabricate the routing substrates in 108(1), 108(2), 208, 708, 808, 908, 1008 in FIGS. 1-2B, 4A-4I, 6A-6B, 7-10, and 12A-12C as other examples.

In this regard, as shown in FIG. 13, a first step in the fabrication process 1300 can be forming a core substrate 124 (block 1302 in FIG. 13). Forming the core substrate 124 can include forming a first core layer 110(1) having a first thickness $H_1$ in a first direction (Z-axis direction) (block 1304 in FIG. 13). Forming the core substrate 124 can also include forming a first cavity 114(1) in the first core layer 110(1), the first cavity 114(1) having the first thickness $H_1$ in the first direction (Z-axis direction) (block 1306 in FIG. 13). Forming the core substrate 124 can also include forming a first opening 204(1)(2) of a second cavity 114(2) in the first core layer 110(1), the first opening 204(1)(2) of the second cavity 114(2) having the first thickness $H_1$ in the first direction (Z-axis direction) (block 1308 in FIG. 13). Forming the core substrate 124 can also include forming a second core layer 110(2) having a second thickness $H_2$ in the first direction (Z-axis direction) (block 1310 in FIG. 13). Forming the core substrate 124 can also include forming a second opening 204(2)(1) of the second cavity 114(2) in the second core layer 110(2), the second opening of the second cavity 114(2) having the second thickness $H_2$ in the first direction (Z-axis direction) (block 1312 in FIG. 13). Forming the core substrate 124 can also include coupling the second core layer 110(2) to the first core layer 110(1), such that the second core layer is at least partially parallel to the first core layer in a second direction orthogonal to the first direction, and the first opening 204(1)(2) of the second cavity 114(2) is aligned with the second opening 204(2)(1) of the second cavity 114(2) in the first direction (Z-axis direction) to create the second cavity 114(2) having a third thickness $H_5$ in the first direction (Z-axis direction) of at least the first thickness $H_1$ and the second thickness $H_2$ in the first direction (Z-axis direction) (block 1314 in FIG. 13). Forming the routing substrate 208 can also include coupling a first metallization structure 122(1) comprising one or more first metallization layers 123 to the first core layer 110(1) (block 1316 in FIG. 13). Forming the routing substrate 208 can also include coupling a second metallization structure 122(2) comprising one or more second metallization layers 125 to the second core layer 110(2), such that the core substrate 124 is between the first metallization structure 122(1) and the second metallization structure 122(2) in the first direction (Z-axis direction) (block 1318 in FIG. 13).

Note that any of the routing substrates referred to herein, including, but not limited to, the routing substrates 108(1), 108(2), 208, 708, 808, 908, 1008 in FIGS. 1-2B, 4A-4I, 6A-6B, 7-10, and 12A-12C, refer to a substrate that has one or more metallization layers that include a metal interconnect(s) to provide signal routing path(s). Also note that by stating that an electrical device is embedded in a cavity, the electrical device could be fully embedded or partially embedded in such cavity. A partially embedded electrical device means that at least a portion of the electrical device extends outside the cavity and its opening in the direction of the cavity. A fully embedded electrical device means that the electrical device is fully embedded within the cavity such that no portion of the electrical device extends outside the cavity and its opening in the direction of the cavity. An electrical device that is at least partially embedded in a cavity means that the electrical device could be fully or partially embedded in the cavity.

An IC package that includes a substrate that includes multiple core layers with multiple cavities formed at multiple depths and supporting multiple embedded electrical devices signal routed to the substrate, including, but not limited to, the routing substrates 108(1), 108(2), 208, 708, 808, 908, 1008 in FIGS. 1-2B, 4A-4I, 6A-6B, 7-10, and 12A-12C, and according to, but not limited to, the exemplary fabrication processes 300, 500, 1100, 1300 in FIGS. 3A-3F, 5, 11A-11C, and 13, may be provided in an IC package provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 14:
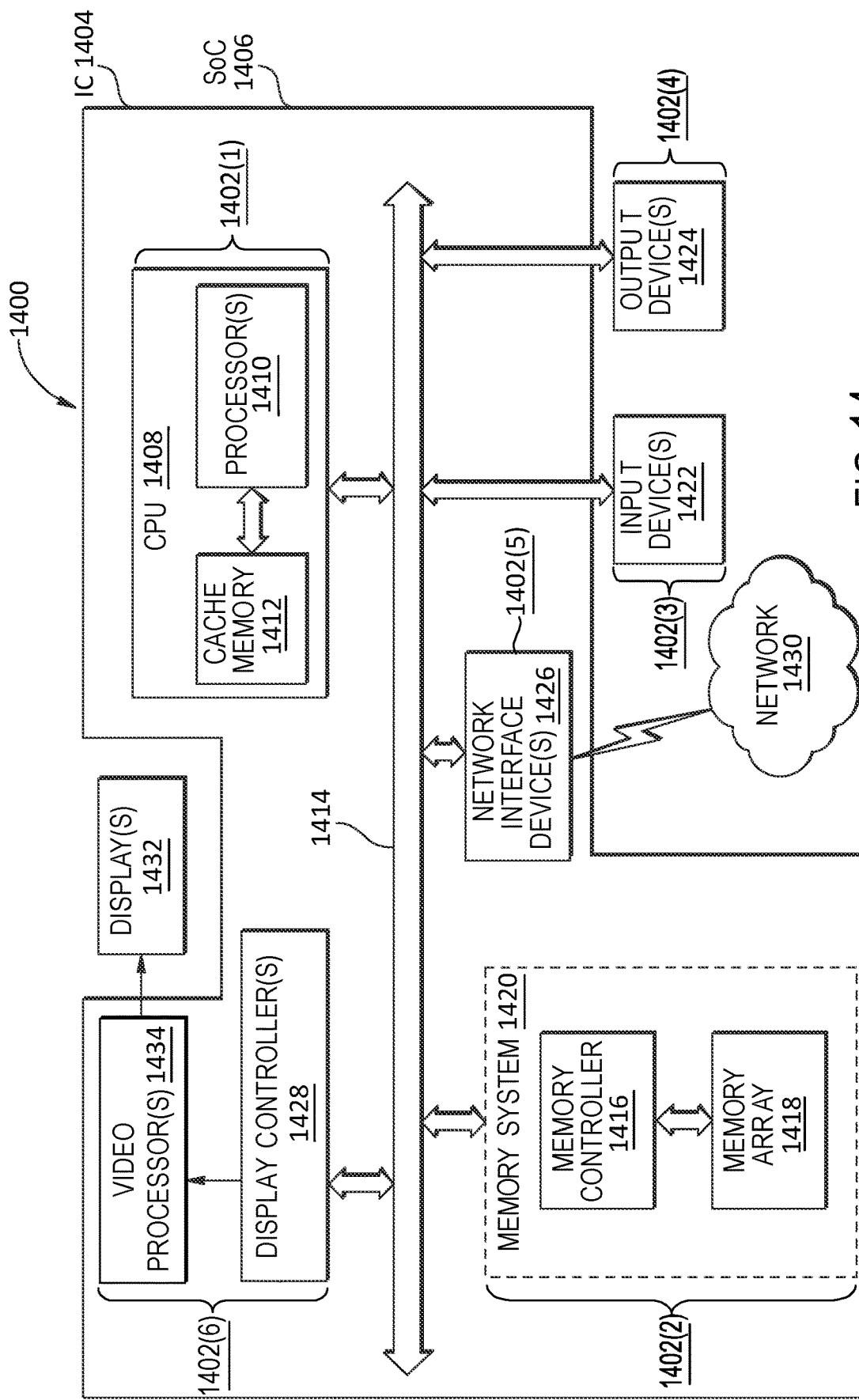
FIG. 14 is a block diagram of an exemplary processor-based system that can include components that can include an IC package that includes a substrate that includes multiple core layers with multiple cavities formed at multiple depths and supporting multiple embedded electrical devices signal routed to the substrate, including, but not limited to, the substrates in FIGS. 1-2B, 4A-4I, 6A-6B, 7-10, and 12A-12C, and according to, but not limited to, the exemplary fabrication processes in FIGS. 3A-3F, 5, 11A-11C, and 13.

In this regard, FIG. 14 illustrates an example of a processor-based system 1400 that includes an IC package(s) 1402, 1402(1)-1402(6) that includes a substrate that includes multiple core layers with multiple cavities formed at multiple depths and supporting multiple embedded electrical devices signal routed to the substrate, including, but not limited to, the routing substrates 108(1), 108(2), 208, 708, 808, 908, 1008 in FIGS. 1-2B, 4A-4I, 6A-6B, 7-10, and 12A-12C, and according to, but not limited to, the exemplary fabrication processes 300, 500, 1100, 1300 in FIGS. 3A-3F, 5, 11A-11C, and 13. In this example, the processor-based system 1400 may be formed as an IC 1404 and as a system-on-a-chip (SoC) 1406. The processor-based system 1400 includes a central processing unit (CPU) 1408 that includes one or more processors 1410, which may also be referred to as CPU cores or processor cores. The CPU 1408 may have cache memory 1412 coupled to the CPU 1408 for rapid access to temporarily stored data. The CPU 1408 is coupled to a system bus 1414 and can intercouple master and slave devices included in the processor-based system 1400. As is well known, the CPU 1408 communicates with these other devices by exchanging address, control, and data information over the system bus 1414. For example, the CPU 1408 can communicate bus transaction requests to a memory controller 1416, as an example of a slave device. Although not illustrated in FIG. 14, multiple system buses 1414 could be provided, wherein each system bus 1414 constitutes a different fabric.

Other master and slave devices can be connected to the system bus 1414. As illustrated in FIG. 14, these devices can include a memory system 1420 that includes the memory controller 1416 and a memory array(s) 1418, one or more input devices 1422, one or more output devices 1424, one or more network interface devices 1426, and one or more display controllers 1428, as examples. The input device(s) 1422 can include any type of input device, including, but not limited to, input keys, switches, voice processors, etc. The output device(s) 1424 can include any type of output device, including, but not limited to, audio, video, other visual indicators, etc. The network interface device(s) 1426 can be any device configured to allow exchange of data to and from a network 1430. The network 1430 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1426 can be configured to support any type of communications protocol desired.

The CPU 1408 may also be configured to access the display controller(s) 1428 over the system bus 1414 to control information sent to one or more displays 1432. The display controller(s) 1428 sends information to the display(s) 1432 to be displayed via one or more video processors 1434, which process the information to be displayed into a format suitable for the display(s) 1432. The display(s) 1432 can include any type of display, including, but not limited to, a cathode ray tube (CRT), a liquid crystal display (LCD), a plasma display, a light emitting diode (LED) display, etc.

Figure 15:
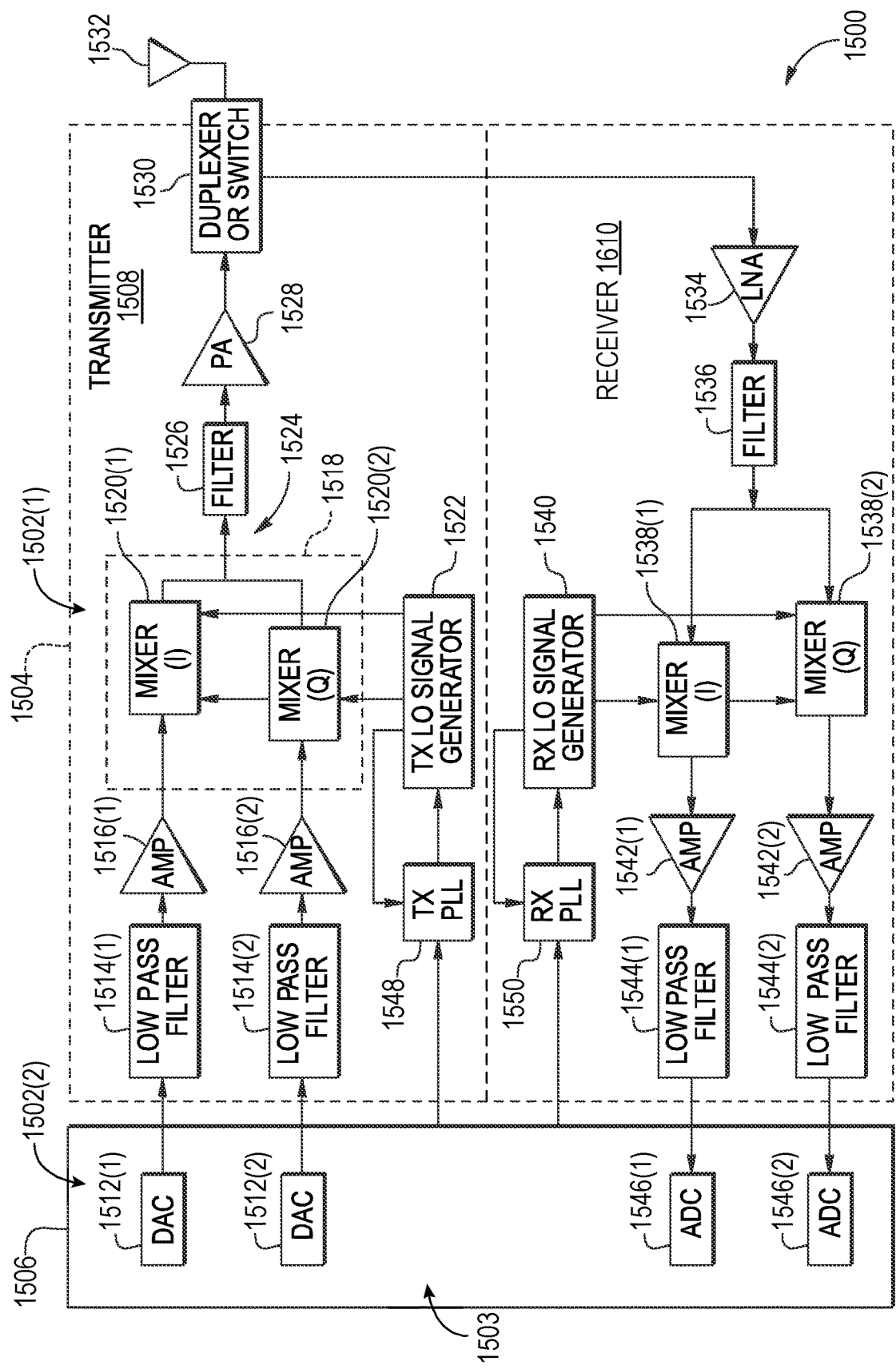
FIG. 15 is a block diagram of an exemplary wireless communications device that includes radio-frequency (RF) components that can include an IC package that includes a substrate that includes multiple core layers with multiple cavities formed at multiple depths and supporting multiple embedded electrical devices signal routed to the substrate, including, but not limited to, the substrates in FIGS. 1-2B, 4A-4I, 6A-6B, 7-10, and 12A-12C, and according to, but not limited to, the exemplary fabrication processes in FIGS. 3A-3F, 5, 11A-11C, and 13.

FIG. 15 illustrates an exemplary wireless communications device 1500 that includes radio frequency (RF) components that can be included in an IC package(s) 1502(1), 1502(2) that includes a substrate that includes multiple core layers with multiple cavities formed at multiple depths and supporting multiple embedded electrical devices signal routed to the substrate, including, but not limited to, the routing substrates 108(1), 108(2), 208, 708, 808, 908, 1008 in FIGS. 1-2B, 4A-4I, 6A-6B, 7-10, and 12A-12C, and according to, but not limited to, the exemplary fabrication processes 300, 500, 1100, 1300 in FIGS. 3A-3F, 5, 11A-11C, and 13. The wireless communications device 1500 may include or be provided in any of the above-referenced devices, as examples. The wireless communications device 1500 may be provided in an IC 1503. As shown in FIG. 15, the wireless communications device 1500 includes a transceiver 1504 and a data processor 1506. The data processor 1506 may include a memory to store data and program codes. The transceiver 1504 includes a transmitter 1508 and a receiver 1510 that support bi-directional communications. In general, the wireless communications device 1500 may include any number of transmitters 1508 and/or receivers 1510 for any number of communication systems and frequency bands. All or a portion of the transceiver 1504 may be implemented on one or more analog ICs, RF ICs (RFICs), mixed-signal ICs, etc.

The transmitter 1508 or the receiver 1510 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1510. In the direct-conversion architecture, a signal is frequency-converted between RF and baseband in one stage. The super-heterodyne and direct-conversion architectures may use different circuit blocks and/or have different requirements. In the wireless communications device 1500 in FIG. 15, the transmitter 1508 and the receiver 1510 are implemented with the direct-conversion architecture.

In the transmit path, the data processor 1506 processes data to be transmitted and provides I and Q analog output signals to the transmitter 1508. In the exemplary wireless communications device 1500, the data processor 1506 includes digital-to-analog converters (DACs) 1512(1), 1512(2) for converting digital signals generated by the data processor 1506 into the I and Q analog output signals, e.g., I and Q output currents, for further processing.

Within the transmitter 1508, lowpass filters 1514(1), 1514(2) filter the I and Q analog output signals, respectively, to remove undesired signals caused by the prior digital-to-analog conversion. Amplifiers (AMPs) 1516(1), 1516(2) amplify the signals from the lowpass filters 1514(1), 1514

(2), respectively, and provide I and Q baseband signals. An upconverter 1518 upconverts the I and Q baseband signals with I and Q transmit (TX) local oscillator (LO) signals through mixers 1520(1), 1520(2) from a TX LO signal generator 1522 to provide an upconverted signal 1524. A filter 1526 filters the upconverted signal 1524 to remove undesired signals caused by the frequency up-conversion as well as noise in a receive frequency band. A power amplifier (PA) 1528 amplifies the upconverted signal 1524 from the filter 1526 to obtain the desired output power level and provides a transmit RF signal. The transmit RF signal is routed through a duplexer or switch 1530 and transmitted via an antenna 1532.

In the receive path, the antenna 1532 receives signals transmitted by base stations and provides a received RF signal, which is routed through the duplexer or switch 1530 and provided to a low noise amplifier (LNA) 1534. The duplexer or switch 1530 is designed to operate with a specific receive (RX)-to-TX duplexer frequency separation, such that RX signals are isolated from TX signals. The received RF signal is amplified by the LNA 1534 and filtered by a filter 1536 to obtain a desired RF input signal. Down-conversion mixers 1538(1), 1538(2) mix the output of the filter 1536 with I and Q RX LO signals (i.e., LO_I and LO_Q) from an RX LO signal generator 1540 to generate I and Q baseband signals. The I and Q baseband signals are amplified by AMPs 1542(1), 1542(2) and further filtered by lowpass filters 1544(1), 1544(2) to obtain I and Q analog input signals, which are provided to the data processor 1506. In this example, the data processor 1506 includes analog-to-digital converters (ADCs) 1546(1), 1546(2) for converting the analog input signals into digital signals to be further processed by the data processor 1506.

In the wireless communications device 1500 of FIG. 15, the TX LO signal generator 1522 generates the I and Q TX LO signals used for frequency up-conversion, while the RX LO signal generator 1540 generates the I and Q RX LO signals used for frequency down-conversion. Each LO signal is a periodic signal with a particular fundamental frequency. A TX phase-locked loop (PLL) circuit 1548 receives timing information from the data processor 1506 and generates a control signal used to adjust the frequency and/or phase of the TX LO signals from the TX LO signal generator 1522. Similarly, an RX PLL circuit 1550 receives timing information from the data processor 1506 and generates a control signal used to adjust the frequency and/or phase of the RX LO signals from the RX LO signal generator 1540.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A substrate, comprising:
    a first metallization structure comprising one or more first metallization layers;

a second metallization structure comprising one or more second metallization layers; and
a core substrate between the first metallization structure and the second metallization structure in a first direction, the core substrate comprising:
 a first core layer having a first thickness in the first direction;
 a second core layer coupled to the first core layer and at least partially parallel to the first core layer in a second direction orthogonal to the first direction, the second core layer having a second thickness;
 a first cavity in the first core layer, the first cavity having the first thickness in the first direction; and
 a second cavity in the first core layer and the second core layer, the second cavity having a third thickness in the first direction of at least the first thickness and the second thickness.

2. The substrate of clause 1, wherein the first thickness and the second thickness are different thicknesses from each other.

3. The substrate of clause 1, wherein the first thickness and the second thickness are each the same thickness.

4. The substrate of any of clauses 1-3, wherein the core substrate further comprises:
 a third core layer coupled to the second core layer and at least partially parallel to the second core layer in the first direction, such that the second core layer is between the first core layer and the third core layer in the first direction, the third core layer having a fourth thickness in the first direction; and
 a third cavity in the first core layer, the second core layer, and the third core layer, the third cavity having a fifth thickness of at least the first thickness, the second thickness, and the fourth thickness.

5. The substrate of clause 4, wherein the core substrate further comprises:
 a fourth core layer coupled to the third core layer and at least partially parallel to the third core layer in the first direction, such that the third core layer is between the second core layer and the fourth core layer in the first direction,
 the fourth core layer having a sixth thickness in the first direction; and a fourth cavity in the first core layer, the second core layer, the third core layer, and the fourth core layer, the fourth cavity having a seventh thickness of at least the first thickness, the second thickness, the fourth thickness, and the sixth thickness.

6. The substrate of any of clauses 1-5, further comprising a plurality of conductive bumps coupling the first core layer to the second core layer.

7. The substrate of any of clauses 1-6, further comprising:
 a first electrical device at least partially embedded in the first cavity;
 a second electrical device at least partially embedded in the second cavity;
 the first electrical device electrically coupled to the first metallization structure; and
 the second electrical device electrically coupled to the first metallization structure.

8. The substrate of clause 7, wherein:
 the first electrical device is a device comprised from the group consisting of a capacitor, a deep trench capacitor (DTC), a resistor, an inductor, an integrated circuit (IC), and an IC die; and
 the second electrical device is a device comprised from the group consisting of a capacitor, a DTC, a resistor, an inductor, an IC, and an IC die.

9. The substrate of clause 7 or 8, wherein:
 a first surface of the first core layer is adjacent to the first metallization structure;
 the first electrical device comprises:
  a first side adjacent to the first metallization structure, and a second side opposite the first side in the first direction and adjacent to the second core layer; and
  at least one first interconnect on the first side and exposed from the first cavity,
   the at least one first interconnect coupled to the first metallization structure; and
 the second electrical device comprises:
  a third side adjacent to the first metallization structure, and a fourth side opposite the third side in the first direction; and
  at least one second interconnect on the third side and exposed from the second cavity,
   the at least one second interconnect coupled to the first metallization structure.

10. The substrate of clause 9, wherein the first electrical device further comprises:
 at least one third interconnect on the second side and exposed from the first cavity, the at least one third interconnect coupled to the second metallization structure.

11. The substrate of clause 10, wherein the second electrical device further comprises:
 at least one fourth interconnect on the fourth side and exposed from the second cavity,
  the at least one fourth interconnect coupled to the second metallization structure.

12. The substrate of clause 7, wherein:
 the second metallization structure comprises a third metallization surface adjacent to the core substrate and a fourth metallization surface opposite the third metallization surface in the first direction;
 further comprising:
  a plurality of external metal interconnects coupled to the second metallization structure; and
 wherein:
  the first electrical device comprises:
   a first side adjacent to the second metallization structure, and a second side opposite the first side in the first direction and adjacent to the second core layer; and
   at least one first interconnect on the first side and exposed from the first cavity,
    the at least one first interconnect coupled to the second metallization structure; and
  the second electrical device comprises:
   a third side adjacent to the second metallization structure, and a fourth side opposite the third side in the first direction; and
   at least one second interconnect on the third side and exposed from the second cavity,
    the at least one second interconnect coupled to the second metallization structure.

13. The substrate of clause 12, wherein the first electrical device further comprises:
 at least one third interconnect on the second side and exposed from the first cavity, the at least one third interconnect coupled to the first metallization structure.

14. The substrate of clause 13, wherein the second electrical device further comprises:
at least one fourth interconnect on the fourth side and exposed from the second cavity,
the at least one fourth interconnect coupled to the first metallization structure.
15. The substrate of any of clauses 1-14, wherein:
the first core layer comprises:
a first surface and a second surface opposite the first surface in the first direction,
the first core layer having the first thickness between the first surface and the second surface;
the second core layer comprises:
a third surface and a fourth surface opposite the third surface in the first direction,
the second core layer having the second thickness between the third surface and the fourth surface;
the first cavity is in the first core layer between the first surface and the second surface; and
the second cavity is in the second core layer between the third surface and the fourth surface.
16. The substrate of any of clauses 1-15, wherein the core substrate further comprises one or more metal posts coupled to the first metallization structure and the second metallization structure.
17. The substrate of any of clauses 1-16, wherein the second metallization structure is at least partially parallel to the first metallization structure in the second direction.
18. The substrate of any of clauses 1-17 integrated into a device selected from a group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.
19. A method of fabricating a substrate, comprising:
forming a core substrate, comprising:
forming a first core layer having a first thickness in a first direction;
forming a first cavity in the first core layer, the first cavity having the first thickness in the first direction;
forming a first opening of a second cavity in the first core layer, the first opening of the second cavity having the first thickness in the first direction;
forming a second core layer having a second thickness in the first direction;
forming a second opening of the second cavity in the second core layer, the second opening of the second cavity having the second thickness in the first direction; and
coupling the second core layer to the first core layer, such that the second core layer is at least partially parallel to the first core layer in a second direction orthogonal to the first direction, and the first opening of the second cavity is aligned with the second opening of the second cavity in the first direction to create the second cavity having a third thickness in the first direction of at least the first thickness and the second thickness;
coupling a first metallization structure comprising one or more first metallization layers to the first core layer; and
coupling a second metallization structure comprising one or more second metallization layers to the second core layer, such that the core substrate is between the first metallization structure and the second metallization structure in the first direction.
20. The method of clause 19, wherein forming the second opening of the second cavity further comprises forming the second opening of the second cavity having the second thickness in the first direction different from the first thickness.
21. The method of clause 19, wherein forming the second opening of the second cavity further comprises forming the second opening of the second cavity having the second thickness in the first direction of the first thickness.
22. The method of any of clauses 19-21, wherein forming the core substrate further comprises:
forming a third core layer having a fourth thickness in the first direction;
coupling the third core layer to the second core layer at least partially parallel to the second core layer in the second direction, such that the second core layer is between the first core layer and the third core layer in the first direction, and the third core layer is adjacent to the second metallization structure; and
forming a third cavity in the first core layer and the second core layer, wherein the third cavity has a fifth thickness of at least the first thickness, the second thickness, and the fourth thickness.
23. The method of any of clauses 19-22, further comprising:
placing a first electrical device in the first cavity;
placing a second electrical device in the second cavity;
electrically coupling the first electrical device to the first metallization structure; and
electrically coupling the second electrical device to the first metallization structure.
24. The method of clause 23, wherein:
the first core layer is adjacent to the first metallization structure;
placing the first electrical device in the first cavity further comprises:
placing a first side of the first electrical device adjacent to the first metallization structure, and placing a second side of the first electrical device opposite the first side of the first electrical device in the first direction adjacent to the first core layer;
exposing at least one first interconnect on the first side of the first electrical device from the first cavity; and
coupling the at least one first interconnect to the first metallization structure; and
placing the second electrical device in the second cavity further comprises:
placing a third side of the second electrical device adjacent to the first metallization structure, and placing a fourth side of the second electrical device opposite the third side in the first direction adjacent to the second core layer;

exposing at least one second interconnect on the third side of the second electrical device from the second cavity; and
coupling the at least one second interconnect to the first metallization structure.

25. The method of clause 24, further comprising:
exposing at least one third interconnect on the second side of the first electrical device from the first cavity; and
coupling the at least one third interconnect to the second metallization structure.

26. The method of clause 23, wherein:
the second core layer is adjacent to the second metallization structure;
the second metallization structure comprises a third metallization surface adjacent to the core substrate and a fourth metallization surface opposite the third metallization surface in the first direction;
further comprising:
coupling a plurality of external metal interconnects coupled to the fourth metallization surface of the second metallization structure; and
wherein:
placing the first electrical device in the first cavity further comprises:
placing a first side of the first electrical device adjacent to the second metallization structure, and placing a second side of the first electrical device opposite the first side in the first direction adjacent to the first core layer;
exposing at least one first interconnect on the first side of the first electrical device from the first cavity;
coupling the at least one first interconnect to the second metallization structure; and
placing the second electrical device in the second cavity further comprises:
placing a third side of the second electrical device adjacent to the second metallization structure, and placing a fourth side of the second electrical device opposite the third side in the first direction adjacent to the second core layer;
exposing at least one second interconnect from the third side of the second electrical device from the second cavity; and
coupling the at least one second interconnect to the second metallization structure.

27. The method of clause 26, further comprising:
exposing at least one third interconnect on the second side of the first electrical device from the first cavity; and
coupling the at least one third interconnect to the first metallization structure.

28. The method of any of clauses 19-27, wherein:
forming the first cavity in the first core layer comprises drilling a first opening of the first cavity of the first thickness in the first direction through the first core layer;
forming the first opening of the second cavity in the first core layer comprises drilling the first opening of the second cavity of the first thickness in the first direction through the first core layer; and
forming the second opening of the second cavity in the second core layer comprises drilling the second opening of the second cavity of the second thickness in the first direction through the second core layer.

29. The method of any of clauses 19-28, further comprising:
drilling one or more third openings in the coupled first metallization structure, the core substrate, and the second metallization structure; and
forming one or more metal posts in the one or more openings extending in the first direction through the first metallization structure, the core substrate, and the second metallization structure.

30. The method of clause 23, wherein:
placing the first electrical device in the first cavity comprises:
suspending the first electrical device with lamination tape adjacent to the first cavity; and
lowering the first electrical device suspended by the lamination tape in the first cavity;
placing the second electrical device in the second cavity comprises:
suspending the second electrical device with the lamination tape adjacent to the second cavity; and
lowering the second electrical device suspended by the lamination tape in the second cavity.

What is claimed is:
1. A substrate, comprising:
a first metallization structure comprising one or more first metallization layers;
a second metallization structure comprising one or more second metallization layers; and
a core substrate between the first metallization structure and the second metallization structure in a first direction, the core substrate comprising:
a first core layer having a first thickness in the first direction;
a second core layer coupled to the first core layer and at least partially parallel to the first core layer in a second direction orthogonal to the first direction, the second core layer having a second thickness;
a first cavity in the first core layer, the first cavity having the first thickness in the first direction;
a second cavity in the first core layer and the second core layer, the second cavity having a third thickness in the first direction of at least the first thickness and the second thickness;
a first electrical device at least partially embedded in the first cavity;
a second electrical device at least partially embedded in the second cavity;
the first electrical device electrically coupled to the first metallization structure; and
the second electrical device electrically coupled to the first metallization structure.

2. The substrate of claim 1, wherein the first thickness and the second thickness are different thicknesses from each other.

3. The substrate of claim 1, wherein the first thickness and the second thickness are each the same thickness.

4. The substrate of claim 1, wherein the core substrate further comprises:
a third core layer coupled to the second core layer and at least partially parallel to the second core layer in the first direction, such that the second core layer is between the first core layer and the third core layer in the first direction, the third core layer having a fourth thickness in the first direction; and
a third cavity in the first core layer, the second core layer, and the third core layer, the third cavity having a fifth thickness of at least the first thickness, the second thickness, and the fourth thickness.

5. The substrate of claim 4, wherein the core substrate further comprises:
a fourth core layer coupled to the third core layer and at least partially parallel to the third core layer in the first direction, such that the third core layer is between the second core layer and the fourth core layer in the first direction, the fourth core layer having a sixth thickness in the first direction; and
a fourth cavity in the first core layer, the second core layer, the third core layer, and the fourth core layer, the fourth cavity having a seventh thickness of at least the first thickness, the second thickness, the fourth thickness, and the sixth thickness.

6. The substrate of claim 1, further comprising a plurality of conductive bumps coupling the first core layer to the second core layer.

7. The substrate of claim 1, wherein:
the first electrical device is a device comprised from the group consisting of a capacitor, a deep trench capacitor (DTC), a resistor, an inductor, an integrated circuit (IC), and an IC die; and
the second electrical device is a device comprised from the group consisting of a capacitor, a DTC, a resistor, an inductor, an IC, and an IC die.

8. The substrate of claim 1, wherein:
a first surface of the first core layer is adjacent to the first metallization structure;
the first electrical device comprises:
a first side adjacent to the first metallization structure, and a second side opposite the first side in the first direction and adjacent to the second core layer; and
at least one first interconnect on the first side and exposed from the first cavity,
the at least one first interconnect coupled to the first metallization structure; and
the second electrical device comprises:
a third side adjacent to the first metallization structure, and a fourth side opposite the third side in the first direction; and
at least one second interconnect on the third side and exposed from the second cavity,
the at least one second interconnect coupled to the first metallization structure.

9. The substrate of claim 8, wherein the first electrical device further comprises:
at least one third interconnect on the second side and exposed from the first cavity,
the at least one third interconnect coupled to the second metallization structure.

10. The substrate of claim 9, wherein the second electrical device further comprises:
at least one fourth interconnect on the fourth side and exposed from the second cavity,
the at least one fourth interconnect coupled to the second metallization structure.

11. The substrate of claim 1, wherein:
the second metallization structure comprises a third metallization surface adjacent to the core substrate and a fourth metallization surface opposite the third metallization surface in the first direction;
further comprising:
a plurality of external metal interconnects coupled to the second metallization structure; and
wherein:
the first electrical device comprises:
a first side adjacent to the second metallization structure, and a second side opposite the first side in the first direction and adjacent to the second core layer; and
at least one first interconnect on the first side and exposed from the first cavity,
the at least one first interconnect coupled to the second metallization structure; and
the second electrical device comprises:
a third side adjacent to the second metallization structure, and a fourth side opposite the third side in the first direction; and
at least one second interconnect on the third side and exposed from the second cavity,
the at least one second interconnect coupled to the second metallization structure.

12. The substrate of claim 11, wherein the first electrical device further comprises:
at least one third interconnect on the second side and exposed from the first cavity,
the at least one third interconnect coupled to the first metallization structure.

13. The substrate of claim 12, wherein the second electrical device further comprises:
at least one fourth interconnect on the fourth side and exposed from the second cavity,
the at least one fourth interconnect coupled to the first metallization structure.

14. The substrate of claim 1, wherein:
the first core layer comprises:
a first surface and a second surface opposite the first surface in the first direction,
the first core layer having the first thickness between the first surface and the second surface;
the second core layer comprises:
a third surface and a fourth surface opposite the third surface in the first direction,
the second core layer having the second thickness between the third surface and the fourth surface;
the first cavity is in the first core layer between the first surface and the second surface; and
the second cavity is in the second core layer between the third surface and the fourth surface.

15. The substrate of claim 1, wherein the core substrate further comprises one or more metal posts coupled to the first metallization structure and the second metallization structure.

16. The substrate of claim 1, wherein the second metallization structure is at least partially parallel to the first metallization structure in the second direction.

17. The substrate of claim 1 integrated into a device selected from a group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

18. A method of fabricating a substrate, comprising:
forming a core substrate, comprising:
    forming a first core layer having a first thickness in a first direction;
    forming a first cavity in the first core layer, the first cavity having the first thickness in the first direction;
    forming a first opening of a second cavity in the first core layer, the first opening of the second cavity having the first thickness in the first direction;
    forming a second core layer having a second thickness in the first direction;
    forming a second opening of the second cavity in the second core layer, the second opening of the second cavity having the second thickness in the first direction; and
    coupling the second core layer to the first core layer, such that the second core layer is at least partially parallel to the first core layer in a second direction orthogonal to the first direction, and the first opening of the second cavity is aligned with the second opening of the second cavity in the first direction to create the second cavity having a third thickness in the first direction of at least the first thickness and the second thickness;
coupling a first metallization structure comprising one or more first metallization layers to the first core layer; and
coupling a second metallization structure comprising one or more second metallization layers to the second core layer, such that the core substrate is between the first metallization structure and the second metallization structure in the first direction.

19. The method of claim 18, wherein forming the second opening of the second cavity further comprises forming the second opening of the second cavity having the second thickness in the first direction different from the first thickness.

20. The method of claim 18, wherein forming the second opening of the second cavity further comprises forming the second opening of the second cavity having the second thickness in the first direction of the first thickness.

21. The method of claim 18, wherein forming the core substrate further comprises:
    forming a third core layer having a fourth thickness in the first direction;
    coupling the third core layer to the second core layer at least partially parallel to the second core layer in the second direction, such that the second core layer is between the first core layer and the third core layer in the first direction, and the third core layer is adjacent to the second metallization structure; and
    forming a third cavity in the first core layer and the second core layer, wherein the third cavity has a fifth thickness of at least the first thickness, the second thickness, and the fourth thickness.

22. The method of claim 18, further comprising:
placing a first electrical device in the first cavity;
placing a second electrical device in the second cavity;
electrically coupling the first electrical device to the first metallization structure; and
electrically coupling the second electrical device to the first metallization structure.

23. The method of claim 22, wherein:
the first core layer is adjacent to the first metallization structure;
placing the first electrical device in the first cavity further comprises:
    placing a first side of the first electrical device adjacent to the first metallization structure, and placing a second side of the first electrical device opposite the first side of the first electrical device in the first direction adjacent to the first core layer;
    exposing at least one first interconnect on the first side of the first electrical device from the first cavity; and
    coupling the at least one first interconnect to the first metallization structure; and
placing the second electrical device in the second cavity further comprises:
    placing a third side of the second electrical device adjacent to the first metallization structure, and placing a fourth side of the second electrical device opposite the third side in the first direction adjacent to the second core layer;
    exposing at least one second interconnect on the third side of the second electrical device from the second cavity; and
    coupling the at least one second interconnect to the first metallization structure.

24. The method of claim 23, further comprising:
exposing at least one third interconnect on the second side of the first electrical device from the first cavity; and
coupling the at least one third interconnect to the second metallization structure.

25. The method of claim 22, wherein:
the second core layer is adjacent to the second metallization structure;
the second metallization structure comprises a third metallization surface adjacent to the core substrate and a fourth metallization surface opposite the third metallization surface in the first direction;
further comprising:
    coupling a plurality of external metal interconnects coupled to the fourth metallization surface of the second metallization structure; and
wherein:
    placing the first electrical device in the first cavity further comprises:
        placing a first side of the first electrical device adjacent to the second metallization structure, and placing a second side of the first electrical device opposite the first side in the first direction adjacent to the first core layer;
        exposing at least one first interconnect on the first side of the first electrical device from the first cavity;
        coupling the at least one first interconnect to the second metallization structure; and
    placing the second electrical device in the second cavity further comprises:
        placing a third side of the second electrical device adjacent to the second metallization structure, and placing a fourth side of the second electrical device opposite the third side in the first direction adjacent to the second core layer;
        exposing at least one second interconnect from the third side of the second electrical device from the second cavity; and
        coupling the at least one second interconnect to the second metallization structure.

26. The method of claim 25, further comprising:
exposing at least one third interconnect on the second side of the first electrical device from the first cavity; and
coupling the at least one third interconnect to the first metallization structure.

27. The method of claim 18, wherein:
forming the first cavity in the first core layer comprises drilling a first opening of the first cavity of the first thickness in the first direction through the first core layer;
forming the first opening of the second cavity in the first core layer comprises drilling the first opening of the second cavity of the first thickness in the first direction through the first core layer; and
forming the second opening of the second cavity in the second core layer comprises drilling the second opening of the second cavity of the second thickness in the first direction through the second core layer.

28. The method of claim 18, further comprising:
drilling one or more third openings in the coupled first metallization structure, the core substrate, and the second metallization structure; and
forming one or more metal posts in the one or more openings extending in the first direction through the first metallization structure, the core substrate, and the second metallization structure.

29. The method of claim 22, wherein:
placing the first electrical device in the first cavity comprises:
suspending the first electrical device with lamination tape adjacent to the first cavity; and
lowering the first electrical device suspended by the lamination tape in the first cavity;
placing the second electrical device in the second cavity comprises:
suspending the second electrical device with the lamination tape adjacent to the second cavity; and
lowering the second electrical device suspended by the lamination tape in the second cavity.

\* \* \* \* \*